(12) United States Patent
Otake

(10) Patent No.: US 7,675,141 B2
(45) Date of Patent: Mar. 9, 2010

(54) SEMICONDUCTOR DEVICE AND METHOD OF MANUFACTURING THE SAME

(75) Inventor: Seiji Otake, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 284 days.

(21) Appl. No.: 11/738,722

(22) Filed: Apr. 23, 2007

(65) Prior Publication Data

US 2007/0246739 A1    Oct. 25, 2007

(30) Foreign Application Priority Data

Apr. 24, 2006    (JP)    .............................. 2006-119651

(51) Int. Cl.
   H01L 27/082    (2006.01)
   H01L 27/102    (2006.01)
   H01L 29/70    (2006.01)
   H01L 31/11    (2006.01)

(52) U.S. Cl. ............... 257/565; 257/575; 257/E27.023; 257/E27.053

(58) Field of Classification Search ................. 257/423, 257/477, 511, 565, 575, 552, 556, 557, E27.019, 257/E27.023, E27.053
   See application file for complete search history.

(56) References Cited

U.S. PATENT DOCUMENTS

| | | | |
|---|---|---|---|
| 5,756,387 A | 5/1998 | Villa et al. | |
| 5,910,664 A | 6/1999 | Ajit | |
| 6,034,413 A * | 3/2000 | Hastings et al. | 257/575 |
| 6,466,423 B1 | 10/2002 | Yu | |
| 6,949,424 B2 | 9/2005 | Springer | |
| 7,202,531 B2 | 4/2007 | Imahashi et al. | |
| 2001/0010954 A1 | 8/2001 | Lin et al. | |
| 2003/0230781 A1 | 12/2003 | Makita et al. | |
| 2006/0118814 A1 | 6/2006 | Cai et al. | |
| 2006/0223258 A1 | 10/2006 | Okushima | |
| 2008/0224220 A1 | 9/2008 | Blanc et al. | |

FOREIGN PATENT DOCUMENTS

| | | |
|---|---|---|
| JP | 07-015010 | 1/1995 |
| JP | 08-148652 | 6/1996 |
| JP | 2001-168206 | 6/2001 |
| JP | 2002-198541 | 7/2002 |

(Continued)

OTHER PUBLICATIONS

Kim, S., *A Study on the Ruggedness of the Insulated Gate Bipolar Transistor*, Doctoral Dissertation, Seoul National University, Feb. 2005, 15 pages.

(Continued)

*Primary Examiner*—Hoai V Pham
(74) *Attorney, Agent, or Firm*—Fish & Richardson P.C.

(57) ABSTRACT

In a semiconductor device of the present invention, an N type epitaxial layer is divided into a plurality of element formation regions by an isolation region. In one of the element formation regions, an NPN transistor is formed. Around the NPN transistor, a protection element having a PN junction region is formed. The PN junction region has a junction breakdown voltage lower than that of a PN junction region of the NPN transistor. By use of this structure, when negative ESD surge is applied to a pad for a base electrode, the PN junction region of the protection element breaks down. Accordingly, the NPN transistor can be protected.

10 Claims, 17 Drawing Sheets

FOREIGN PATENT DOCUMENTS

| | | |
|---|---|---|
| JP | 2002-313947 | 10/2002 |
| JP | 2003-188381 | 7/2003 |
| KR | 10-0200538 | 5/1996 |
| KR | 2002-0052954 | 7/2002 |

OTHER PUBLICATIONS

Otake, list of claims, "Semiconductor Device and Method of Manufacturing the Same," U.S. Appl. No. 11/738,621, filed Apr. 23, 2007.

* cited by examiner

SEMICONDUCTOR DEVICE AND METHOD OF MANUFACTURING THE SAME

BACKGROUND OF THE INVENTION

Priority is claimed to Japanese Patent Application Number JP2006-119651 filed on Apr. 24, 2006, the disclosure of which is incorporated herein by reference in its entirety.

1. Field of the Invention

The present invention relates to a semiconductor device in which ESD (Electro-Static Discharge) resistance is improved, and a method of manufacturing the same.

2. Description of the Related Art

As an example of conventional semiconductor devices, the following device using surge protection elements has been known. For example, a total of four surge protection elements are disposed respectively near four sides of a rectangular or substantially rectangular pad, one on each side. The pad is connected with one of electrodes of each of the surge protection elements by wiring. A wire for distributing a surge current is connected with the other one of the electrodes of each of the surge protection elements by wiring. Note that a potential of the pad is supplied to an internal circuit through the wiring. Moreover, each of the surge protection elements is, for example, a Zener diode, a PMOS diode or an NMOS diode. By use of this structure, the surge current applied to the pad is dispersed to all of the surge protection elements disposed around the pad. Accordingly, a surge breakdown resistance of a semiconductor device is improved. This technique is described for instance in Japanese Patent Application Publication No. 2002-313947.

As another example of conventional semiconductor devices, the following insulated gate bipolar transistor including surge protection elements has been known. For example, an N type epitaxial layer used as a drift layer is formed on a P type semiconductor substrate used as a collector layer. In an N type epitaxial layer used as an internal cell part, P type diffusion layers used as channel regions are formed. Moreover, in each of the P type diffusion layers, N type diffusion layers used as emitter regions are formed. Furthermore, in an N type epitaxial layer used as an electrode pad or a field plate part, a P type diffusion layer having the same shape as that of the P type diffusion layer used as the channel region is formed. By use of this structure, when ESD surge is applied to a collector electrode, avalanche breakdown occurs evenly in the entirety of a chip. Accordingly, current concentration in a certain region is prevented. As a result, surge resistance of the entirety of the chip to ESD is improved. This technique is described for instance in Japanese Patent Application Publication No. 2003-188381.

As described above, a structure for the conventional semiconductor device has been known, in which a plurality of surge protection elements are disposed around a pad, and in which a surge current applied to the pad is dispersed to all of the surge protection elements. By using this structure, the surge current is prevented from flowing into an internal circuit, and is thereby prevented from breaking down the internal circuit. However, the following problem may occur depending on the magnitude of the surge current and the like. Specifically, a problem of breakdown of an internal circuit may occur, when the surge current is too large, for example. This is because the surge protection elements around the pad cannot cope with such a large surge current into the internal circuit.

Moreover, as described above, a structure for the conventional semiconductor device has been known, in which avalanche breakdown occurs evenly in the entirety of a chip when ESD surge is applied to a collector electrode. In this structure, the avalanche breakdown also occurs in an internal cell when the ESD surge is applied. Accordingly, depending on the magnitude of the applied ESD surge, a problem may occur that the internal cell is broken down.

SUMMARY OF THE INVENTION

The present invention was made in consideration of the foregoing circumstances. A semiconductor device of the present invention includes a semiconductor layer, a bipolar transistor formed in the semiconductor layer, a first junction region between a diffusion layer included in the bipolar transistor and the semiconductor layer and a protection element. The protection element is arranged around a formation region of the bipolar transistor, and has a second junction region having a junction breakdown voltage lower than that of the first junction region. Accordingly, in the present invention, the second junction region of the protection element breaks down before the first junction region of the bipolar transistor. By use of this structure, the bipolar transistor can be protected from an overvoltage.

Moreover, the semiconductor device of the present invention further includes an isolation region which divides the semiconductor layer. The bipolar transistor is formed in one of regions divided by the isolation region. Moreover, the protection element is formed by utilizing the isolation region surrounding the formation region of the bipolar transistor. Accordingly, in the present invention, the protection element is formed by utilizing the isolation region. By use of this structure, a current generated by the overvoltage is caused to flow into a substrate through the isolation region, and then dispersed.

Moreover, in the semiconductor device of the present invention, the semiconductor layer is formed by staking a semiconductor substrate of one conductivity type with at least one epitaxial layer of opposite conductivity type. In addition, the second junction region is formed of a first diffusion layer of the one conductivity type and a diffusion layer of the opposite conductivity type. The first diffusion layer of the one conductivity type is connected by wiring to the diffusion layer used as a base region of the bipolar transistor. The diffusion layer of the opposite conductivity type is formed in the epitaxial layer. The diffusion layer of the opposite conductivity type is disposed so as to overlap a second diffusion layer of the one conductivity type connected to the semiconductor substrate. Accordingly, in the present invention, the current generated by the overvoltage is dispersed after flowing into the substrate through the diffusion layer of the one conductivity type connected to the substrate.

Moreover, the semiconductor device of the present invention further includes an isolation region which divides the epitaxial layer. The second diffusion layer of the one conductivity type is a diffusion layer included in the isolation regions. Accordingly, in the present invention, the current generated by the overvoltage is dispersed into the substrate through the isolation region. Moreover, by utilizing the isolation region, a dedicated protection element can be formed for each semiconductor element.

Moreover, in the semiconductor device of the present invention, the first diffusion layer of the one conductivity type and the diffusion layer of the opposite conductivity type are circularly disposed around the formation region of the bipolar transistor, and along a formation region of the isolation region. Accordingly, in the present invention, by utilizing the isolation region, it is possible to prevent concentration of the current, which is generated by the overvoltage, in the protection element.

Moreover, in the semiconductor device of the present invention, the protection element operates as a bipolar transistor. Therefore, in the present invention, by operating the protection element as the bipolar transistor, current capacity in the protection element can be improved.

Moreover, in the semiconductor device of the present invention, the semiconductor layer is formed by laminating at least one epitaxial layer of opposite conductivity type on a semiconductor substrate of one conductivity type. The second junction region is formed of a first diffusion layer of the one conductivity type connected by wiring to a diffusion layer used as a collector region of the bipolar transistor, and a diffusion layer of the opposite conductivity type formed in the epitaxial layer. The diffusion layer of the opposite conductivity type is disposed so as to overlap with a second diffusion layer of the one conductivity type connected to the semiconductor substrate. Therefore, the present invention can realize a structure which protects an NPN transistor and a PNP transistor from the overvoltage.

A method for manufacturing a semiconductor device according to the present invention is a method for manufacturing a semiconductor device in which at least one epitaxial layer of opposite conductivity type is formed on a semiconductor substrate of one conductivity type, isolation regions are formed, which divide the epitaxial layer into a plurality of element formation regions, and a bipolar transistor is formed in one of the plurality of element formation regions. The method includes the steps of forming a first diffusion layer of the one conductivity type around a formation region of the bipolar transistor, forming a diffusion layer of the opposite conductivity type which partially overlaps with the first diffusion layer of the one conductivity type and a second diffusion layer of the one conductivity type included in the isolation regions, and connecting a diffusion layer as a base region of the bipolar transistor to the first diffusion layer of the one conductivity type by use of a wiring layer on the epitaxial layer. Therefore, in the present invention, by forming a protection element around the formation region of the bipolar transistor, the bipolar transistor can be protected from an overvoltage.

Moreover, in the method for manufacturing a semiconductor device according to the present invention, the diffusion layer as the base region of the bipolar transistor and the first diffusion layer of the one conductivity type are formed in a same process. Therefore, in the present invention, by forming the diffusion layer for a back gate and the diffusion layer for the protection element in the same process, manufacturing costs can be reduced.

Moreover, a method for manufacturing a semiconductor device according to the present invention is a method for manufacturing a semiconductor device in which at least one epitaxial layer of opposite conductivity type is formed on a semiconductor substrate of one conductivity type, isolation regions are formed, which divide the epitaxial layer into a plurality of element formation regions, and a bipolar transistor is formed in one of the plurality of element formation regions. The method includes the steps of forming a first diffusion layer of the one conductivity type around a formation region of the bipolar transistor, forming a diffusion layer of the opposite conductivity type which partially overlaps with the first diffusion layer of the one conductivity type and a second diffusion layer of the one conductivity type included in the isolation regions, and connecting a diffusion layer as a collector region of the bipolar transistor to the first diffusion layer of the one conductivity type by use of a wiring layer on the epitaxial layer. Therefore, the present invention can realize a structure which protects an NPN transistor and a PNP transistor from an overvoltage.

DETAILED DESCRIPTION OF THE PREFERRED EMBODIMENTS

Figure 1:
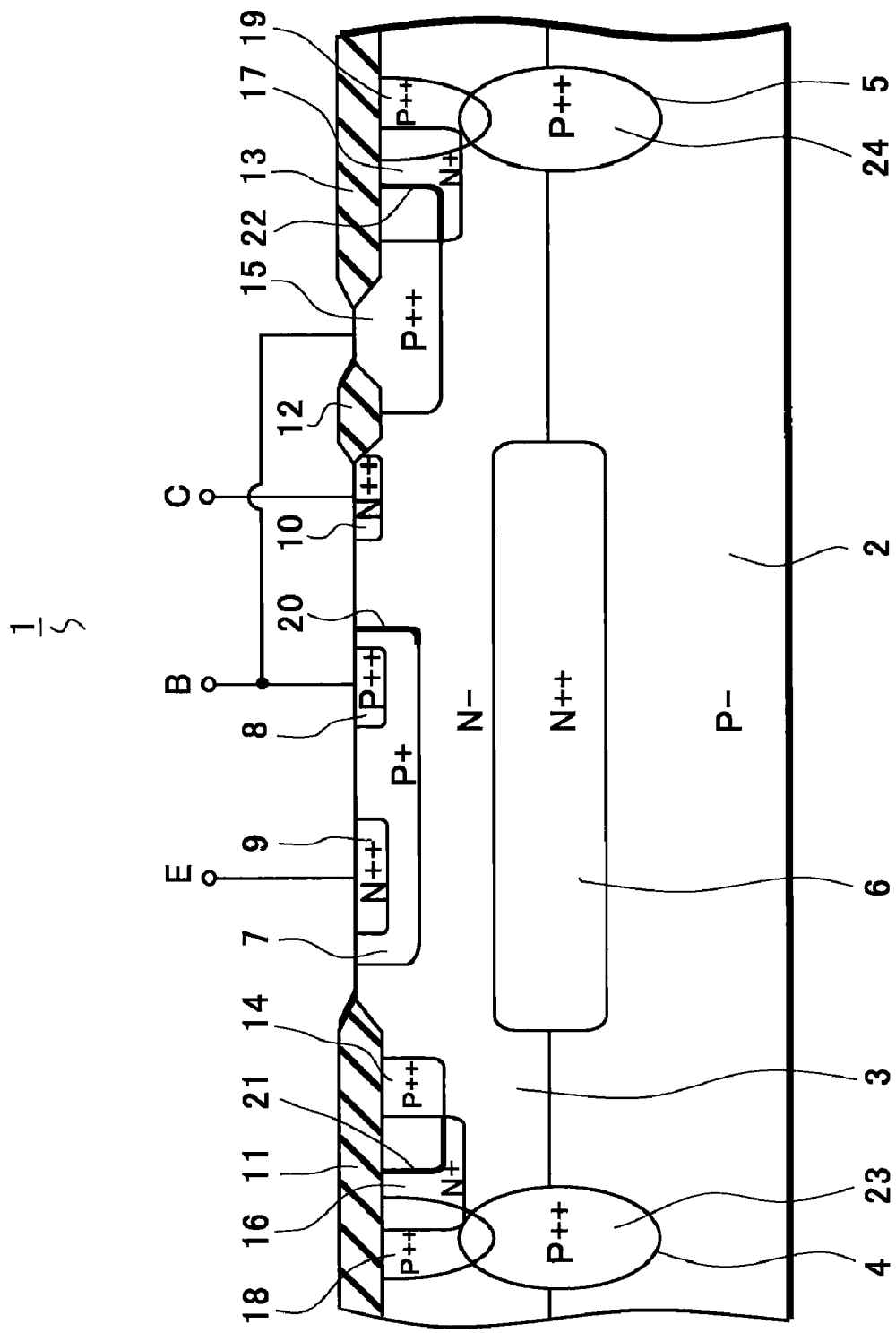
FIG. 1 is a cross-sectional view showing a semiconductor device according to a first embodiment of the present invention.
Figure 2:
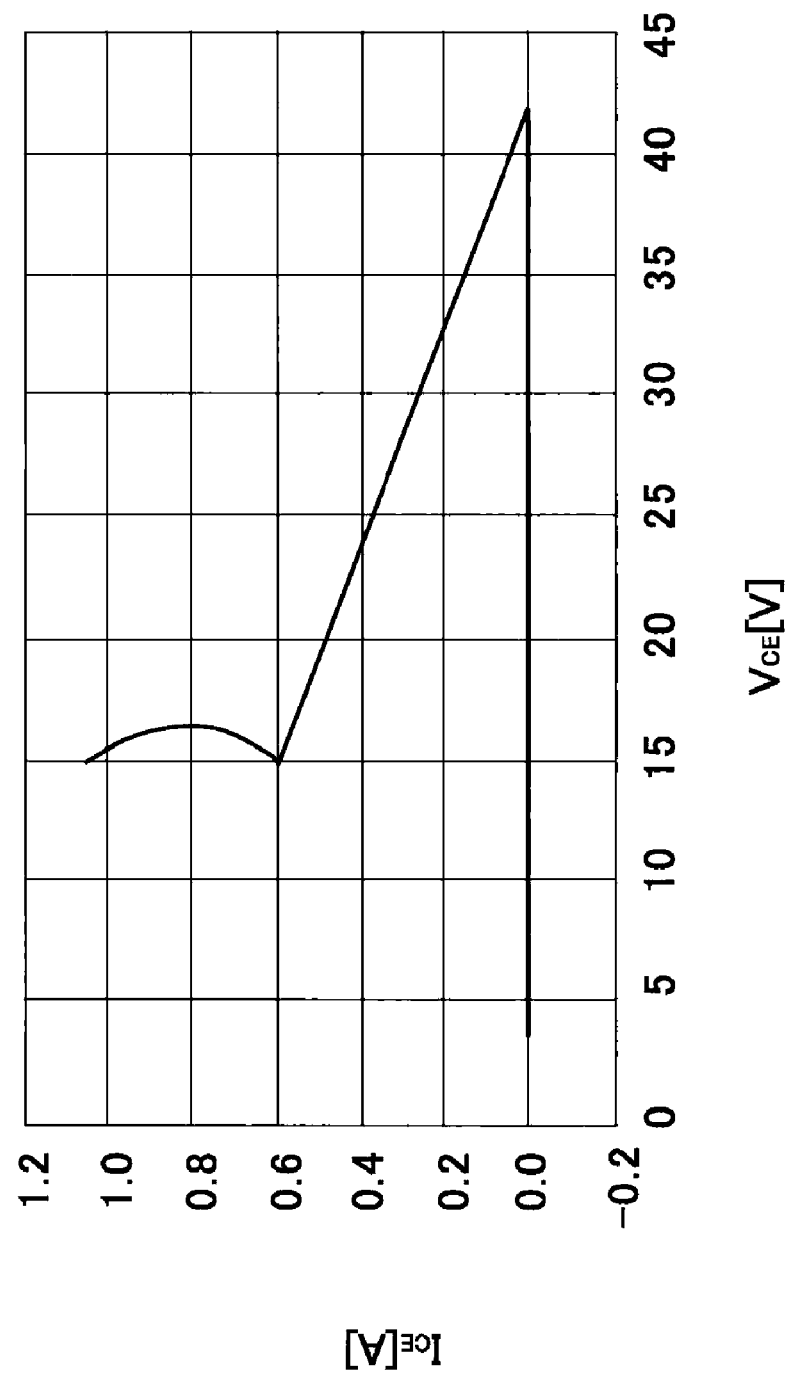
FIG. 2 is a graph showing characteristics of a protection element in the semiconductor device according to the first embodiment of the present invention.

With reference to FIGS. 1 and 2, a semiconductor device according to a first embodiment of the present invention will be described in detail below. FIG. 1 is a cross-sectional view for describing the semiconductor device according to this embodiment. FIG. 2 is a graph for describing characteristics of a protection element in this embodiment.

As shown in FIG. 1, an NPN transistor 1 mainly includes a P type single crystal silicon substrate 2, an N type epitaxial layer 3, isolation regions 4 and 5, an N type buried diffusion layer 6, P type diffusion layers 7 and 8 used as base regions, an N type diffusion layer 9 used as an emitter region, and an N type diffusion layer 10 used as a collector region.

The N type epitaxial layer 3 is formed on the P type single crystal silicon substrate 2. Note that, although one epitaxial layer 3 is formed on the substrate 2 in this embodiment, the present invention is not limited to this case. For example, the substrate is stacked with a plurality of epitaxial layers.

Each of the isolation regions 4 and 5 is formed so as to extend in the substrate 2 and the epitaxial layer 3. The epitaxial layer 3 is divided into a plurality of element formation regions by the isolation regions 4 and 5. For example, each of the isolation regions 4 and 5 is formed circularly surrounding a region where the NPN transistor 1 is formed (hereinafter such a region is referred to as a formation region).

The N type buried diffusion layer 6 is formed so as to extend in the substrate 2 and the epitaxial layer 3. As shown in FIG. 1, the N type buried diffusion layer 6 is formed across the formation region of the NPN transistor I defined by the isolation regions 4 and 5.

The P type diffusion layer 7 is formed in the epitaxial layer 3. The P type diffusion layer 7 is used as the base region. Moreover, the P type diffusion layer 8 is formed so as to overlap the P type diffusion layer 7. The P type diffusion layer 8 is used as a base lead-out region.

The N type diffusion layer 9 is formed in the P type diffusion layer 7. The N type diffusion layer 9 is used as the emitter region.

The N type diffusion layer 10 is formed in the epitaxial layer 3. The N type diffusion layer 10 is used as the collector region.

LOCOS (Local Oxidation of Silicon) oxide films 11 to 13 are formed in the epitaxial layer 3. Each of the LOCOS oxide films 11 to 13 has a thickness of, for example, about 3000 to 10000 Å in its flat portion.

P type diffusion layers 14 and 15 are formed in the epitaxial layer 3. The P type diffusion layers 14 and 15 are disposed around the formation region of the NPN transistor 1 in the region defined by the isolation regions 4 and 5. In addition, as shown in FIG. 1, the P type diffusion layers 14 and 15 are wired so as to have the same potential as a base potential of the NPN transistor 1. Note that the P type diffusion layers 14 and 15 may be circularly disposed around the formation region of the NPN transistor 1, along the arrangement of the isolation regions 4 and 5.

N type diffusion layers 16 and 17 are formed in the epitaxial layer 3. The N type diffusion layers 16 and 17 are formed so as to at least partially overlap the P type diffusion layers 14 and 15, respectively. Furthermore, the N type diffusion layers 16 and 17 are formed so as to at least partially overlap P type diffusion layers 18 and 19 included in the isolation regions 4 and 5, respectively. The N type diffusion layers 16 and 17 are not connected directly to a wiring layer (not shown) on the epitaxial layer 3. However, a collector potential is substantially applied thereto through the epitaxial layer 3. Note that the N type diffusion layers 16 and 17 may be circularly disposed around the formation region of the NPN transistor 1, and along the arrangement of the isolation regions 4 and 5.

Next, as indicated by a thick solid line in FIG. 1, a PN junction region 20 is formed between the P type diffusion layer 7 as the base region of the NPN transistor 1 and the N type epitaxial layer 3 as the collector region. As described above, the base potential is applied to the P type diffusion layers 14 and 15. Meanwhile, the collector potential is applied to the N type epitaxial layer 3 through the N type diffusion layer 10. That is, a reverse bias is applied to the PN junction region 20 of the NPN transistor 1.

Note that, as shown in FIG. 1, in the NPN transistor 1, the PN junction region is formed across a boundary region between the P type diffusion layer 7 and the epitaxial layer 3. However, in this embodiment, the P type diffusion layer 7 as the base region and the N type diffusion layer 10 as the collector region are disposed so as to face each other, and a region to be a current path is indicated by the thick line. Specifically, the PN junction region 20 indicated by the thick solid line is a region likely to break down due to current concentration caused when an overvoltage is applied thereto.

In addition, as indicated by thick solid lines, a PN junction region 21 is formed between the P type diffusion layer 14 and the N type diffusion layer 16 around the formation region of the NPN transistor 1. Moreover, a PN junction region 22 is formed between the P type diffusion layer 14 and the N type diffusion layer 17. That is, the PN junction regions 21 and 22 are formed around the formation region of the NPN transistor 1. As described above, the same potential as the base potential is applied to the P type diffusion layers 14 and 15 through the wiring layer on the epitaxial layer 3. Meanwhile, the collector potential is substantially applied to the N type diffusion layers 16 and 17 through the epitaxial layer 3. That is, substantially the same reverse bias as that applied to the PN junction region 20 is applied to the PN junction regions 21 and 22.

Here, the PN junction regions 21 and 22 are formed so as to have a junction breakdown voltage lower than that of the PN junction region 20. For example, as shown in FIG. 1, there is a structure in which the P type diffusion layer 7 and the P type diffusion layers 14 and 15 are formed in different processes from each other. In addition, the P type diffusion layer 7 is formed so as to have an impurity concentration lower than that of the P type diffusion layers 14 and 15. Moreover, the N type diffusion layers 16 and 17 are formed in the N type epitaxial layer 3. Specifically, in each of the PN junction regions 21 and 22, impurity concentrations of the respective P type and N type regions thereof are increased, compared with the PN junction region 20. In addition, the junction breakdown voltage of the PN junction regions 21 and 22 is controlled so that the PN junction regions 21 and 22 have a desired characteristic value.

Moreover, although not shown in FIG. 1, there is a structure in which the P type diffusion layers 7, 14 and 15 are formed in a same process so as to have the same impurity concentration. In this case, formation of the N type diffusion layers 16 and 17 in the N type epitaxial layer 3 increases the impurity concentration on the N type region side in the PN junction regions 21 and 22 compared with the PN junction region 20. Specifically, by controlling the impurity concentration of the N type diffusion layers 16 and 17, the junction breakdown voltage of the PN junction regions 21 and 22 is controlled to have the desired characteristic value.

By use of the structure described above, for example, when an overvoltage, for example, negative ESD surge is applied to a pad for a base electrode of the NPN transistor 1, the PN junction regions 21 and 22 break down before the PN junction region 20 does. Accordingly, a breakdown current flows through the PN junction regions 21 and 22, and the PN junction region 20 is prevented from breaking down. In this manner, the NPN transistor 1 can be protected from the ESD surge. Specifically, protection elements having the PN junction regions 21 and 22 are operated against the ESD surge, and thereby the NPN transistor 1 is protected.

Furthermore, in the protection elements having the PN junction regions 21 and 22, the PN junction regions 21 and 22 are formed across a wide region by disposing the P type diffusion layers 14 and 15 and the N type diffusion layers 16 and 17, and along the arrangement of the isolation regions 4 and 5. This structure makes it possible to prevent concentration of the breakdown current in the PN junction regions 21 and 22. Accordingly, it is possible to suppress breakdown of the protection elements having the PN junction regions 21 and 22.

Furthermore, the protection elements having the PN junction regions 21 and 22 are formed by utilizing the isolation regions 4 and 5 within the element formation region defined by the isolation regions 4 and 5. By use of this structure, the junction breakdown voltage of the protection element can be determined according to each of semiconductor elements formed in the element formation region defined by the isolation regions. That is, protection elements suitable for the respective semiconductor elements can be individually disposed, and thus each of the semiconductor elements can be protected from the ESD surge and the like. For example, even when an ESD surge protection element is disposed around the pad for the base electrode, the semiconductor elements can be more surely protected by further forming the protection elements described above in the formation regions of the respective semiconductor elements. In addition, an actual operation region of a chip can be effectively utilized by using the isolation regions to include the protection elements in each of the element formation regions.

In FIG. 2, a horizontal axis shows a collector-emitter voltage ($V_{CE}$) of a PNP transistor, and a vertical axis shows a collector-emitter current ($I_{CE}$) of the PNP transistor. Note that FIG. 2 shows data on the PNP transistor in which the P type diffusion layers 14 and 15 (see FIG. 1) are set to be emitter regions, the N type diffusion layers 16 and 17 (see FIG. 1) are set to be base regions, and the P type diffusion layers 18, 19, 23 and 24 (see FIG. 1) are set to be collector regions.

As described above, the N type diffusion layers 16 and 17 having the PN junction regions 21 and 22 formed respectively therein are formed so as to also overlap the P type diffusion layers 18 and 19. The P type diffusion layers 18, 19, 23 and 24 are electrically connected to the substrate 2 in order to form the isolation regions 4 and 5. By use of this structure, the protection elements having the PN junction regions 21 and 22 operate as the PNP transistors including the P type diffusion layers 14 and 15, the N type diffusion layers 16 and 17, and the P type diffusion layers 18, 19, 23 and 24.

For example, suppose a case where negative ESD surge is applied to the pad for the base electrode in the NPN transistor 1. When the PN junction regions 21 and 22 break down, a current flows between the base and the emitter of the PNP transistor, and the PNP transistor is turned on. When the PNP transistor is turned on, a breakdown current flows into the substrate 2. That is, when each of the protection elements having the PN junction regions 21 and 22 operates as a bipolar transistor, the breakdown current flows into the substrate 2 and disperses therein.

In this event, as shown in FIG. 2, a reverse bias is applied between the collector and the emitter of the PNP transistor, and the PNP transistor is turned on when $V_{CE}$ becomes 42 (V), for example. Moreover, when the PNP transistor is turned on, the conductivity modulation is caused at the P type diffusion layers 18, 19, 23 and 24 used as the collector regions. Accordingly, a resistance value is significantly reduced, and current capacity is improved. Specifically, when each of the protection elements having the PN junction regions 21 and 22 operates as the bipolar transistor, capacity of the breakdown current flowing into the substrate 2 is improved.

Moreover, as shown in FIG. 1, when the breakdown current flows through the isolation regions 4 and 5, potentials of the substrate 2 and the isolation regions 4 and 5 are changed. However, by operating the protection element as the bipolar transistor, a range of potential changes in the substrate 2 and the isolation regions 4 and 5 can be decreased. Moreover, the potential change in the substrate 2 can prevent malfunction of semiconductor elements formed in other element formation regions.

Meanwhile, for example, when positive ESD surge is applied to the pad for the base electrode in the NPN transistor 1, a forward bias is applied to the PN junction region 20 and the PN junction regions 21 and 22. In this case, as described above, the PN junction regions 21 and 22 become low resistance regions by the N type diffusion layers 16 and 17. Moreover, by disposing the P type diffusion layers 14 and 15 and the N type diffusion layers 16 and 17 in wide regions, and along the isolation regions 4 and 5, a current path width is increased. Accordingly, the PN junction regions 21 and 22 become much lower resistance regions. By use of this structure, a current generated by application of the positive ESD surge flows into the substrate 2 mainly through the PN junction regions 21 and 22. Also in this event, when each of the protection elements having the PN junction regions 21 and 22 operates as the bipolar transistor, capacity of the current flowing into the substrate 2 is improved. Moreover, the NPN transistor 1 is protected by preventing breakdown of the PN junction region 20 due to concentration of the current generated by application of the positive ESD surge.

Next, with reference to FIGS. 4 to 10, detailed description will be given of a method of manufacturing a semiconductor device according to the first embodiment of the present invention. FIGS. 4 to 10 are cross-sectional views showing the method of manufacturing a semiconductor device according to this embodiment. Note that FIGS. 4 to 10 show a method of manufacturing the semiconductor device shown in FIG. 1.

Figure 4:
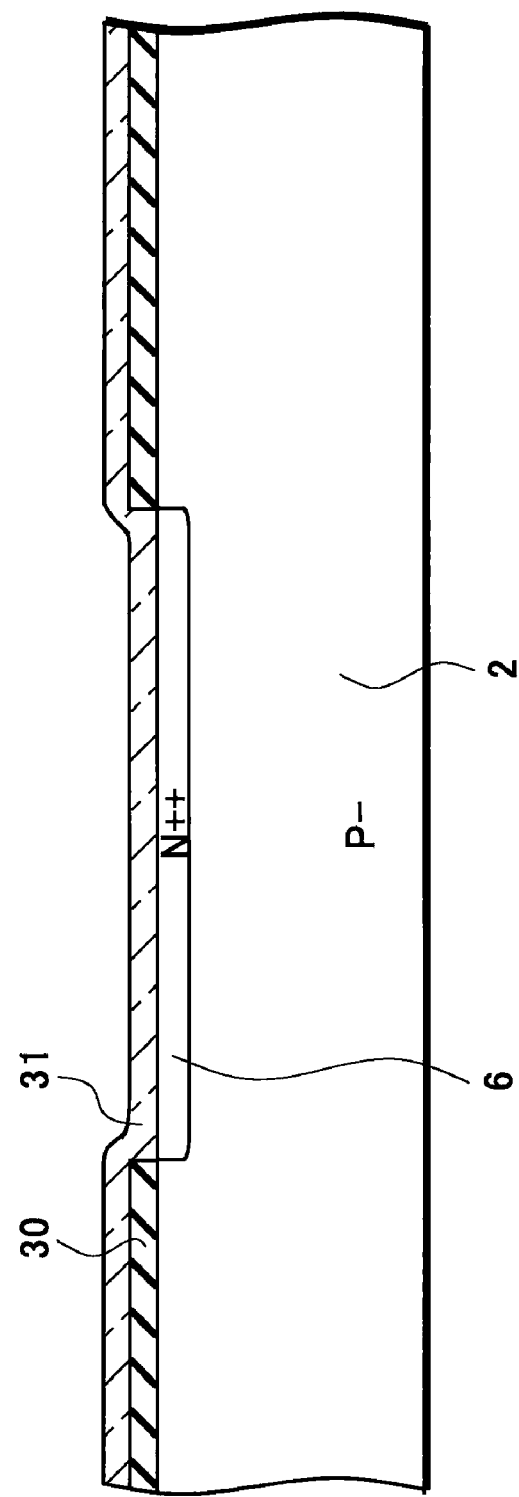
FIG. 4 is a first cross-sectional view showing a method of manufacturing a semiconductor device according to the first embodiment of the present invention.

First, as shown in FIG. 4, a P type single crystal silicon substrate 2 is prepared. A silicon oxide film 30 is formed on the substrate 2, and the silicon oxide film 30 is selectively removed so as to form an opening in a formation region of an N type buried diffusion layer 6. Thereafter, by using the silicon oxide film 30 as a mask, a liquid source 31 containing an N type impurity, for example, antimony (Sb) is applied onto a surface of the substrate 2 by use of a spin-coating method. Subsequently, after antimony (Sb) is thermally diffused to form the N type buried diffusion layer 6, the silicon oxide film 30 and the liquid source 31 are removed.

Figure 5:
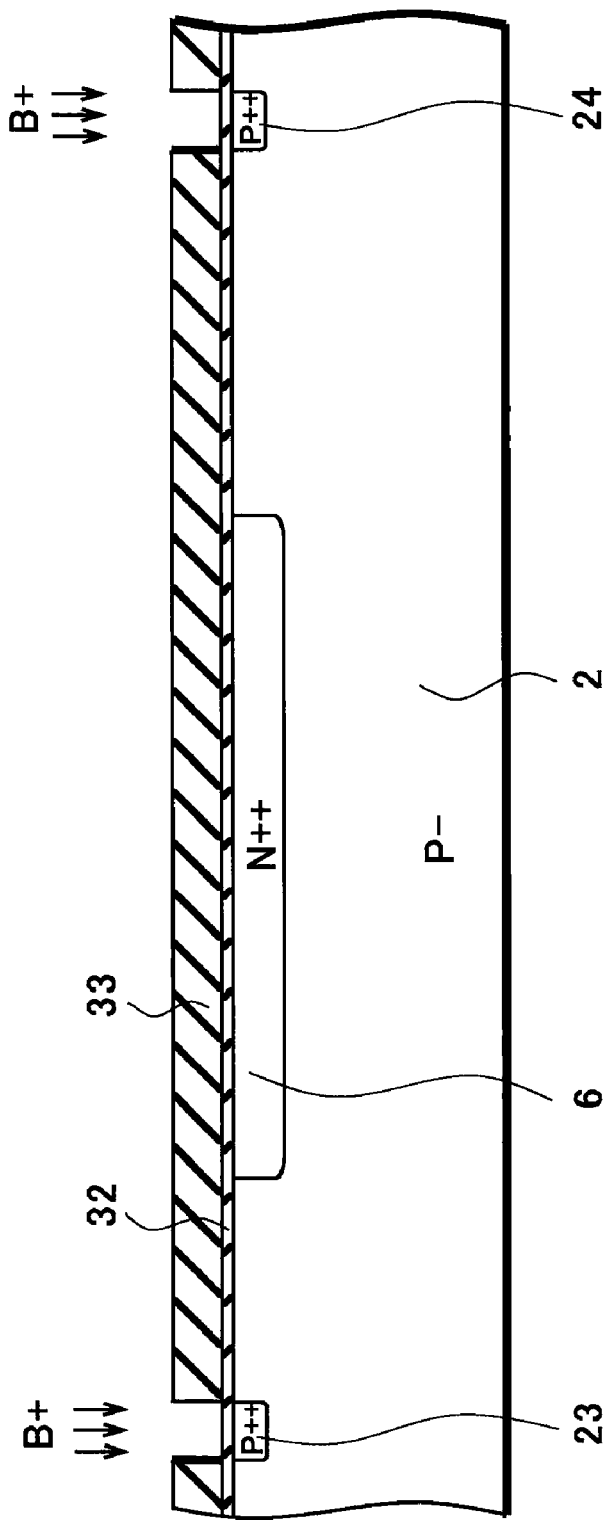
FIG. 5 is a second cross-sectional view showing the method of manufacturing a semiconductor device according to the first embodiment of the present invention.

Next, as shown in FIG. 5, a silicon oxide film 32 is formed on the substrate 2 and a photoresist 33 is formed on the silicon oxide film 32. Thereafter, by use of a heretofore known photolithography technique, openings are formed in the photoresist 33 on regions where P type buried diffusion layers 23 and 24 are to be respectively formed. Subsequently, ions of a P type impurity, for example, boron (B) are implanted from the surface of the substrate 2 at an accelerating voltage of 40 to 180 (keV) and a dose of $1.0 \times 10^{13}$ to $1.0 \times 10^{16}$ (/cm$^2$). After the photoresist 33 is removed and the P type buried diffusion layers 23 and 24 are formed by thermal diffusion, the silicon oxide film 32 is removed.

Figure 6:
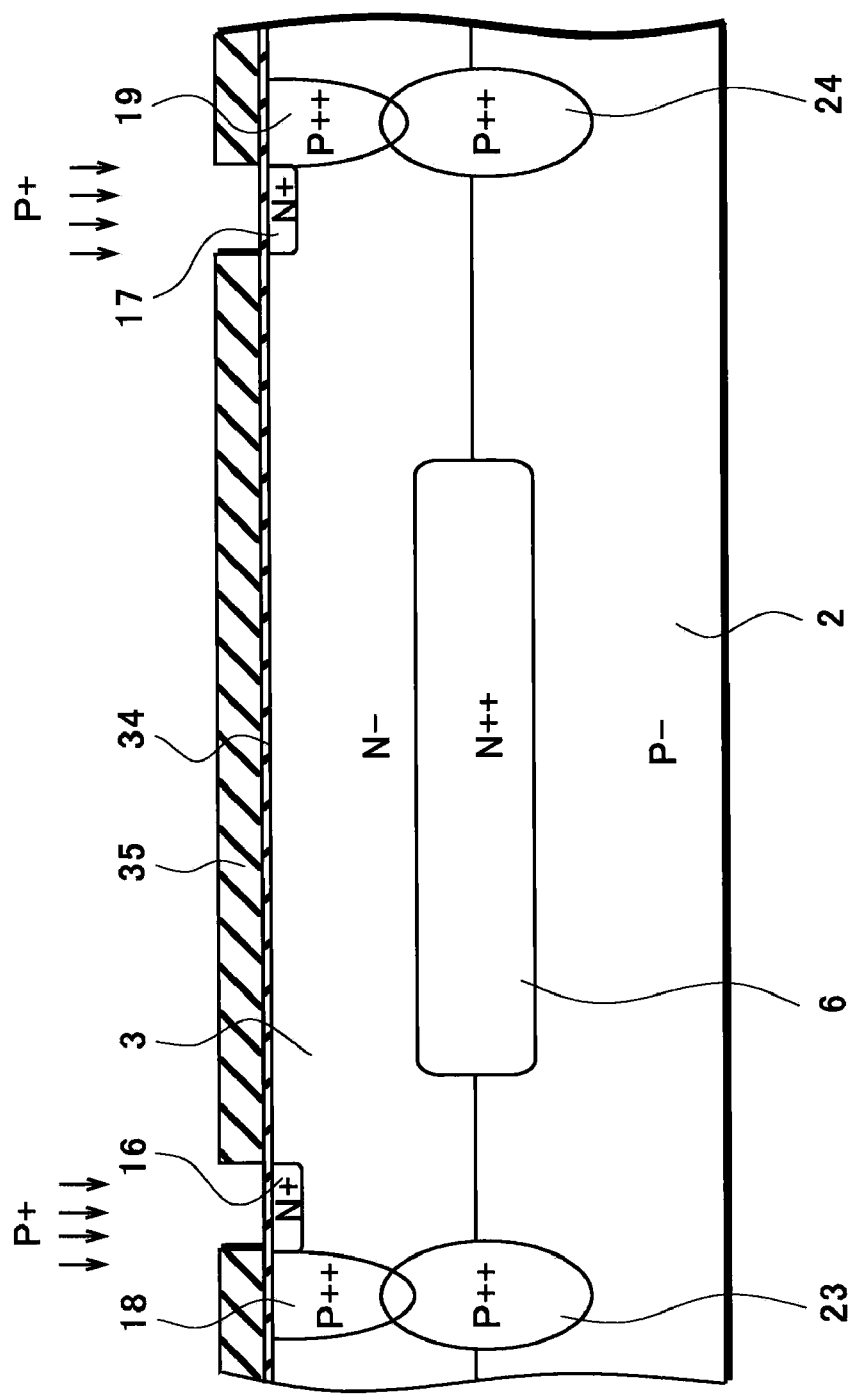
FIG. 6 is a third cross-sectional view showing the method of manufacturing a semiconductor device according to the first embodiment of the present invention.

Next, as shown in FIG. 6, the substrate 2 is placed on a susceptor of a vapor phase epitaxial growth apparatus, and an N type epitaxial layer 3 is formed on the substrate 2. The vapor phase epitaxial growth apparatus mainly includes a gas supply system, a reactor, an exhaust system and a control system. In this embodiment, by use of a vertical reactor, thickness uniformity of the epitaxial layer can be improved. The N type buried diffusion layer 6 and the P type buried diffusion layers 23 and 24 are thermally diffused by heat treatment in the step of forming the epitaxial layer 3.

Next, by use of the heretofore known photolithography technique, P type diffusion layers 18 and 19 are formed in the epitaxial layer 3. Thereafter, a silicon oxide film 34 is formed on the epitaxial layer 3, and a photoresist 35 is formed on the silicon oxide film 34. Subsequently, by use of the heretofore known photolithography technique, openings are formed in the photoresist 35 on regions where N type diffusion layers 16 and 17 are to be respectively formed. Thereafter, ions of an N type impurity, for example, phosphorus (P) are implanted from the surface of the epitaxial layer 3 at an accelerating voltage of 40 to 180 (keV) and a dose of $1.0 \times 10^{13}$ to $1.0 \times 10^{16}$ (/cm$^2$). Subsequently, the photoresist 35 is removed, and the N type diffusion layers 16 and 17 are formed by thermal diffusion. Note that an impurity concentration of the N type diffusion layers 16 and 17 is controlled so as to cause a junction breakdown voltage of PN junction regions 21 and 22 (see FIG. 1) to be lower than that of a PN junction region 20 (see FIG. 1).

Figure 7:
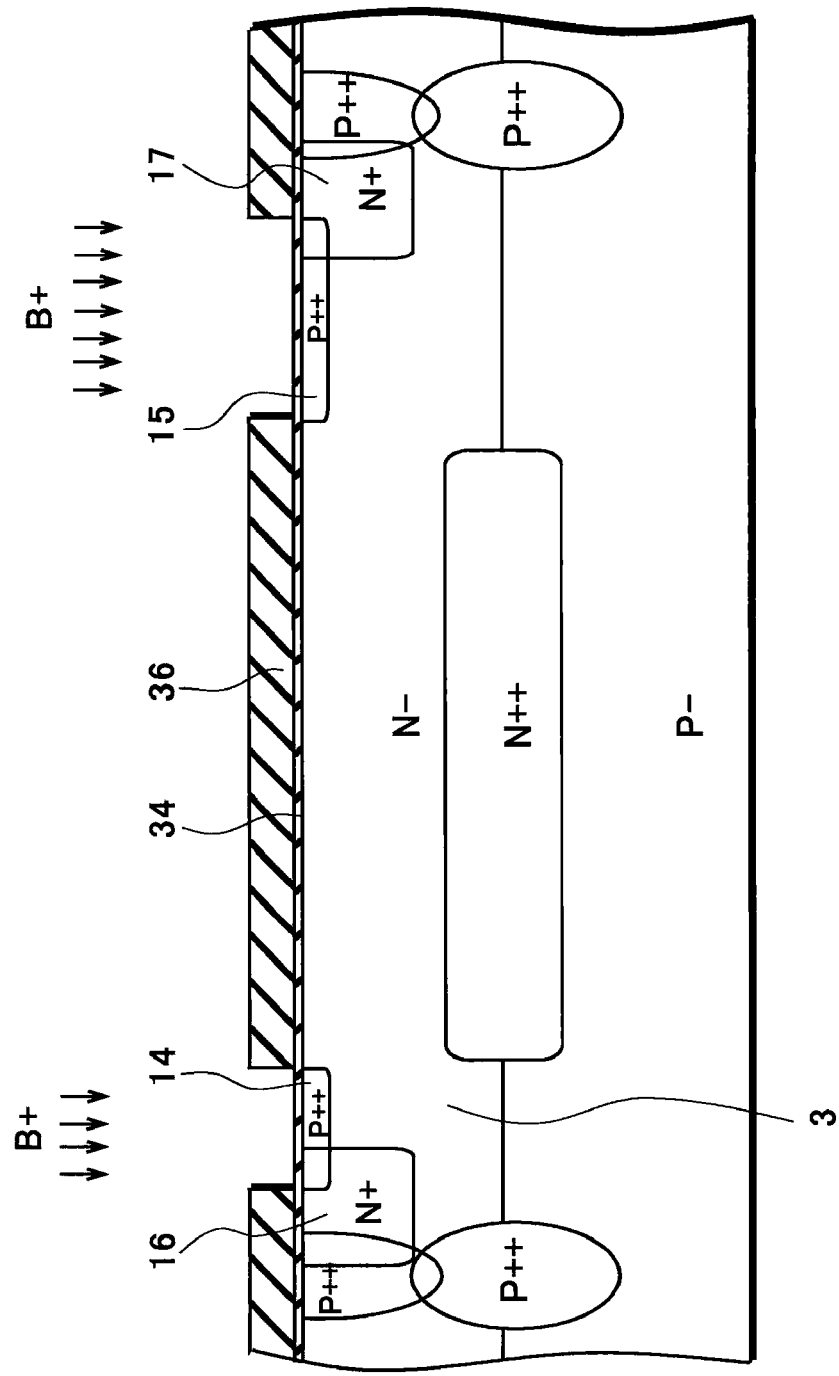
FIG. 7 is a fourth cross-sectional view showing the method of manufacturing a semiconductor device according to the first embodiment of the present invention.

Next, as shown in FIG. 7, a photoresist 36 is formed on the silicon oxide film 34. Thereafter, by use of the heretofore known photolithography technique, openings are formed in the photoresist 36 on regions where P type diffusion layers 14 and 15 are to be respectively formed. Subsequently, ions of a P type impurity, for example, boron (B) are implanted from the surface of the epitaxial layer 3 at an accelerating voltage of 30 to 200 (keV) and a dose of $1.0 \times 10^{16}$ to $1.0 \times 10^{18}$ (/cm$^2$). After the photoresist 36 is removed and the P type diffusion layers 14 and 15 are formed by thermal diffusion, the silicon oxide film 34 is removed. Note that an impurity concentration of the P type diffusion layers 14 and 15 is controlled so as to cause the junction breakdown voltage of the PN junction regions 21 and 22 (see FIG. 1) to be lower than that of the PN junction region 20 (see FIG. 1).

Figure 8:
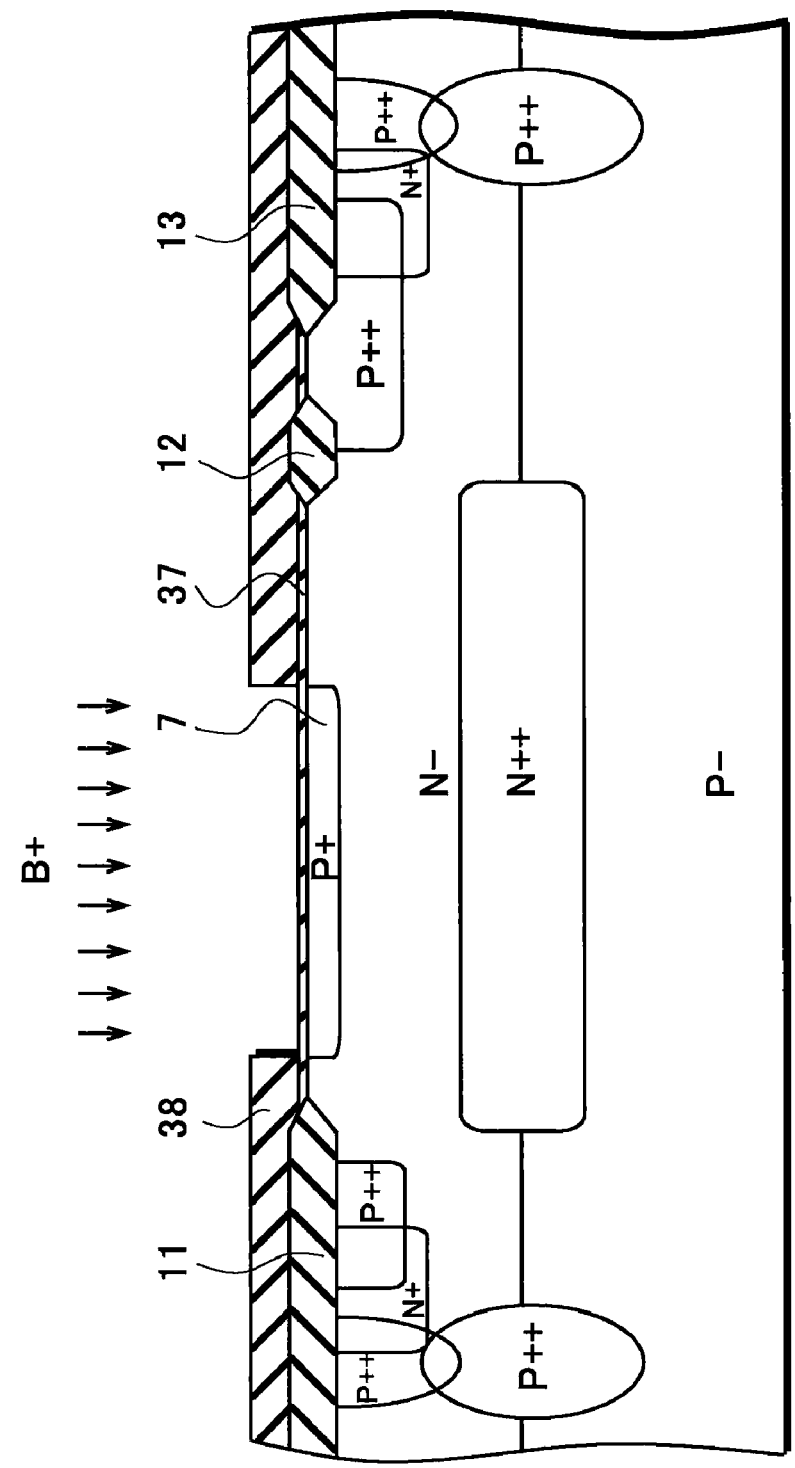
FIG. 8 is a fifth cross-sectional view showing the method of manufacturing a semiconductor device according to the first embodiment of the present invention.

Next, as shown in FIG. 8, LOCOS oxide films 11 to 13 are formed in desired regions of the epitaxial layer 3. Thereafter, a silicon oxide film 37 is formed on the epitaxial layer 3, and a photoresist 38 is formed on the silicon oxide film 37. By use of the heretofore known photolithography technique, an opening is formed in the photoresist 38 on a region where a P type diffusion layer 7 is to be formed. Subsequently, ions of a P type impurity, for example, boron (B) is implanted from the surface of the epitaxial layer 3 at an accelerating voltage of 40 to 180 (keV) and a dose of $1.0 \times 10^{13}$ to $1.0 \times 10^{15}$ (/cm$^2$). Thereafter, the photoresist 38 is removed, and the P type diffusion layer 7 is formed by thermal diffusion.

Figure 9:
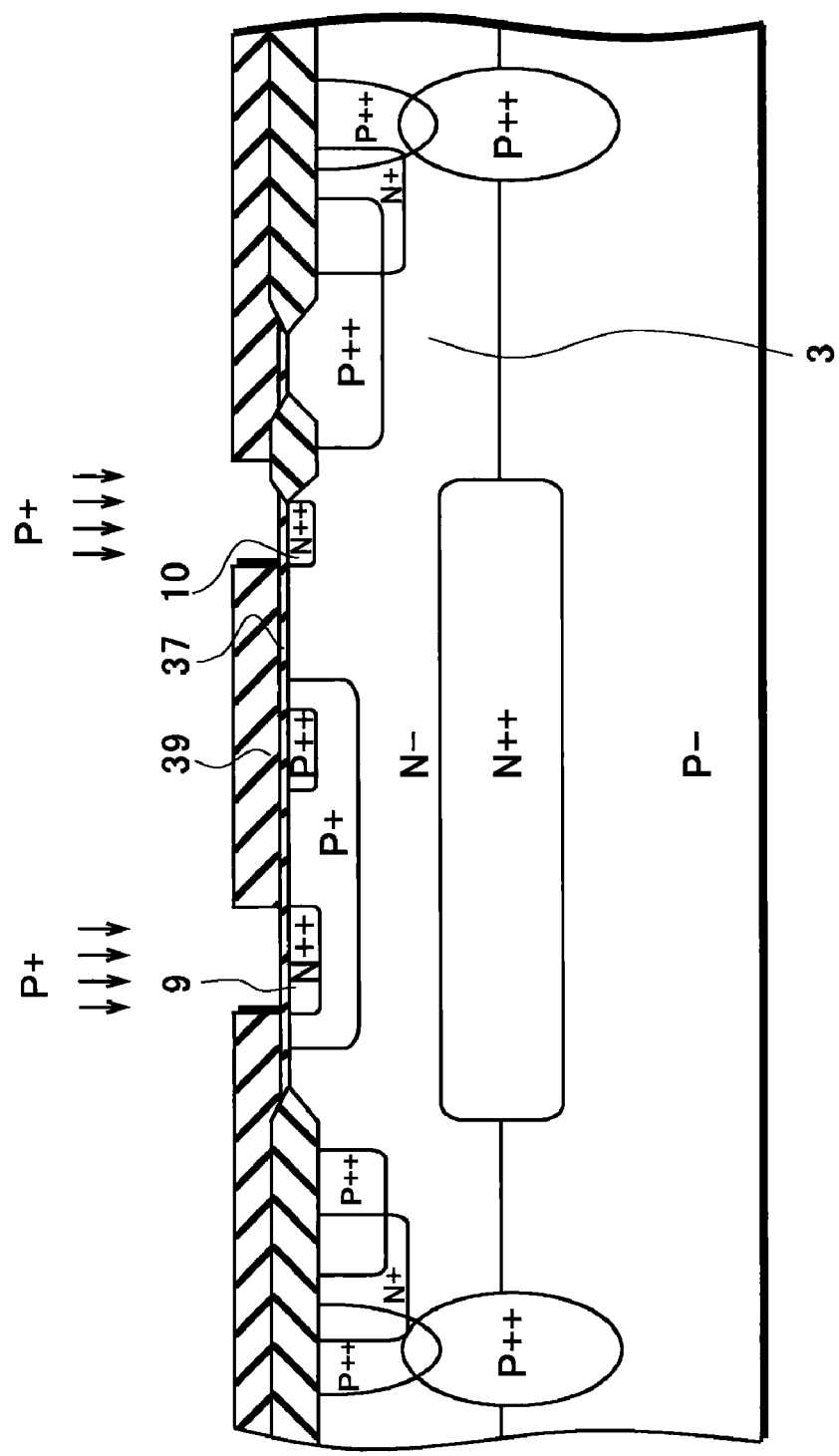
FIG. 9 is a sixth cross-sectional view showing the method of manufacturing a semiconductor device according to the first embodiment of the present invention.

Next, as shown in FIG. 9, a photoresist 39 is formed on the silicon oxide film 37. By use of the heretofore known photolithography technique, openings are formed in the photoresist 39 on regions where N type diffusion layers 9 and 10 are to be formed. Subsequently, ions of an N type impurity, for example, phosphorus (P) is implanted from the surface of the epitaxial layer 3 at an accelerating voltage of 70 to 190 (keV) and a dose of $1.0 \times 10^{14}$ to $1.0 \times 10^{16}$ (/cm$^2$). Thereafter, the photoresist 39 is removed, the N type diffusion layers 9 and 10 are formed by thermal diffusion, and the silicon oxide film 37 is removed.

Figure 10:
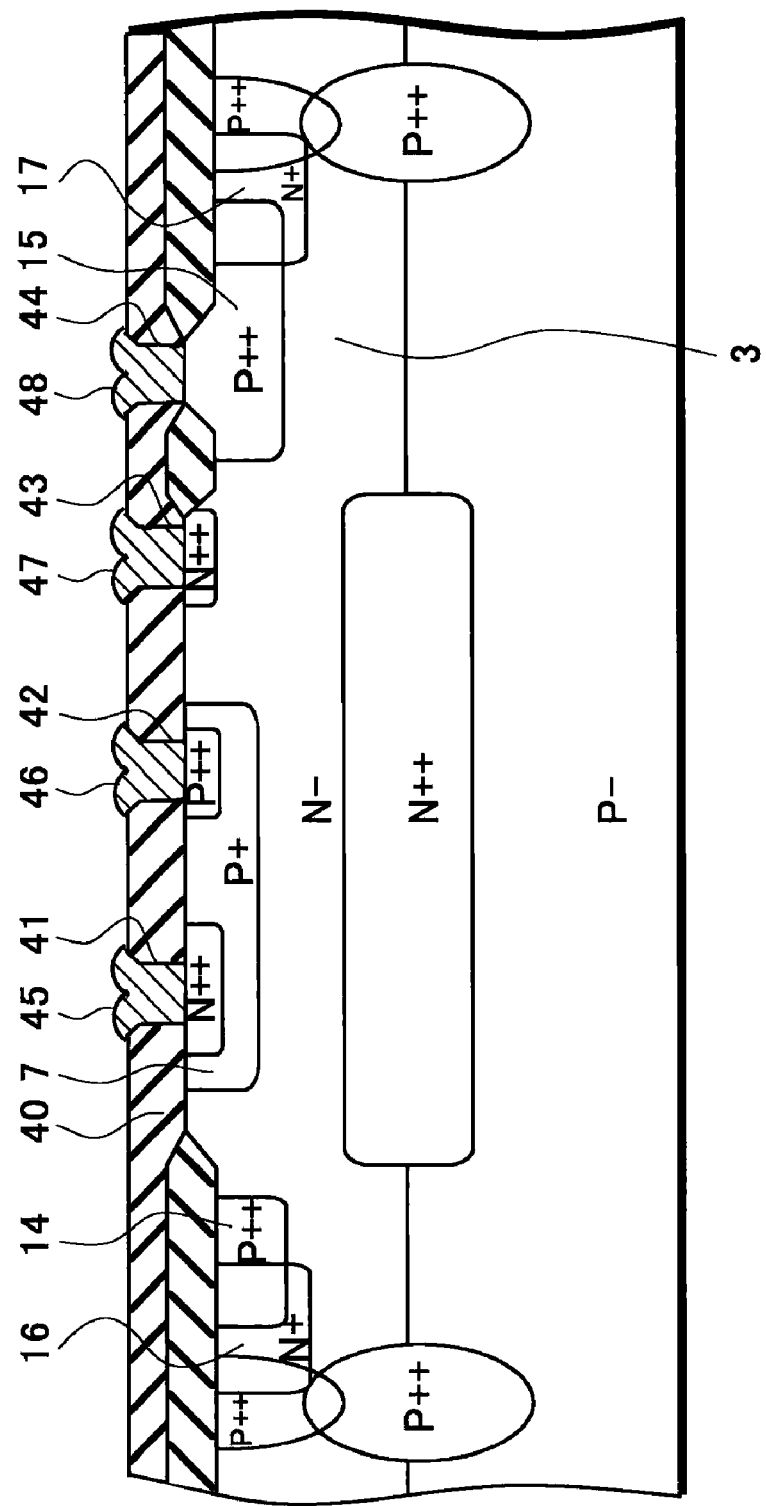
FIG. 10 is a seventh cross-sectional view showing the method of manufacturing a semiconductor device according to the first embodiment of the present invention.

Next, as shown in FIG. 10, as an insulating layer 40, for example, a BPSG (Boron Phospho Silicate Glass) film, a SOG (Spin On Glass) film or the like is deposited on the epitaxial layer 3. Thereafter, by use of the heretofore known photolithography technique, contact holes 41 to 44 are formed in the insulating layer 40 by dry etching using, for example, CHF$_3$ or CF$_4$ gas. In the contact holes 41 to 44, aluminum alloy films made of, for example, an Al—Si film, an Al—Si—Cu film, an Al—Cu film and the like are selectively formed. Thereby, an emitter electrode 45, a base electrode 46, a collector electrode 47 and an electrode 48 connected to the P type diffusion layer 15 are formed.

Note that, in this embodiment, description was given of the case where the P type diffusion layer 7 and the P type diffusion layers 14 and 15 are formed in different processes. However, the embodiment of the present invention is not limited to this case. For example, the P type diffusion layers 7, 14 and 15 may be formed in the same process. In this case, the P type diffusion layers 7, 14 and 15 are diffusion layers formed under the same conditions, and have substantially the same impurity concentration. As a result, by controlling conditions for forming the N type diffusion layers 16 and 17, for example, the impurity concentration thereof, the junction breakdown voltage of the PN junction regions 21 and 22 is caused to be lower than that of the PN junction region 20. In other words, the junction breakdown voltage is determined by the conditions for forming the N type diffusion layers 16 and 17. Accordingly, control of the junction breakdown voltage is facilitated. Besides the above, various modifications can be made without departing from the scope of the embodiment of the present invention.

Figure 3:
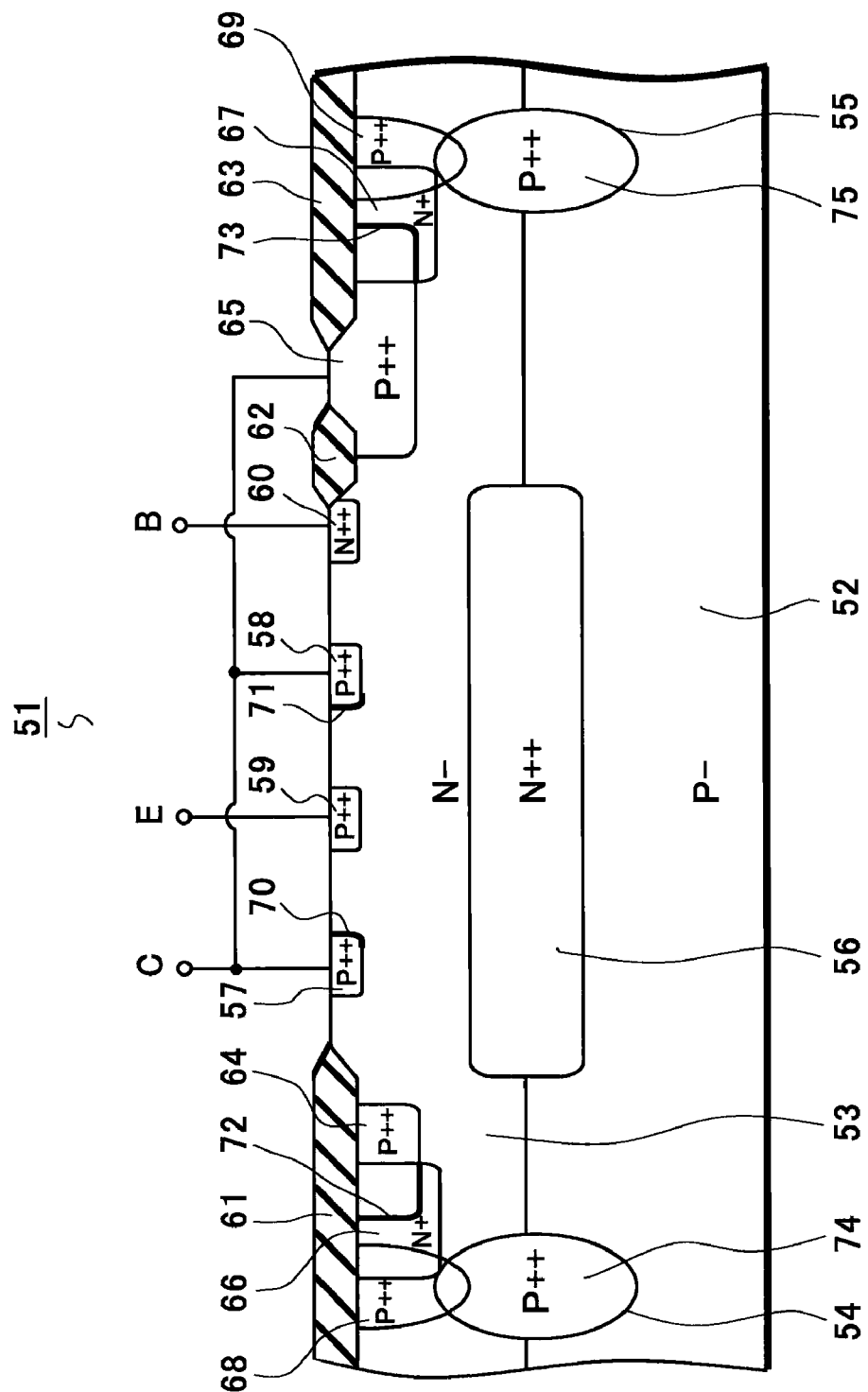
FIG. 3 is a cross-sectional view showing a semiconductor device according to a second embodiment of the present invention.

Next, with reference to FIG. 3, a semiconductor device according to a second embodiment of the present invention will be described in detail. FIG. 3 is a cross-sectional view for explaining the semiconductor device according to this embodiment.

As shown in FIG. 3, a PNP transistor 51 mainly includes a P type single crystal silicon substrate 52, an N type epitaxial layer 53, isolation regions 54 and 55, an N type buried diffusion layer 56, P type diffusion layers 57 and 58 used as collector regions, a P type diffusion layer 59 used as an emitter region, and an N type diffusion layer 60 used as a base lead-out region.

The N type epitaxial layer 53 is formed on the P type single crystal silicon substrate 52. Note that, although one epitaxial layer 53 is formed on the substrate 52 in this embodiment, the present invention is not limited to this case. For example, the substrate is stacked with a plurality of epitaxial layers.

Each of the isolation regions 54 and 55 is formed so as to extend in the substrate 52 and the epitaxial layer 53. The epitaxial layer 53 is divided into a plurality of element formation regions by the isolation regions 54 and 55. For example, the isolation regions 54 and 55 are circularly formed so as to surround a formation region of the PNP transistor 51.

The N type buried diffusion layer 56 is formed so as to extend in both regions of the substrate 52 and the epitaxial layer 53. As shown in FIG. 3, the N type buried diffusion layer 56 is formed across the formation region of the PNP transistor 51 defined by the isolation regions 54 and 55.

The P type diffusion layers 57 and 58 are formed in the epitaxial layer 53. The P type diffusion layers 57 and 58 are used as the collector regions. Note that the P type diffusion layers 57 and 58 may be circularly formed around the P type diffusion layer 59.

The P type diffusion layer 59 is formed in the epitaxial layer 53. The P type diffusion layer 59 is used as the emitter region.

The N type diffusion layer 60 is formed in the epitaxial layer 53. The N type diffusion layer 60 is used as the base lead-out region.

LOCOS (Local Oxidation of Silicon) oxide films 61 to 63 are formed in the epitaxial layer 53. Each of the LOCOS oxide films 61 to 63 has a thickness of, for example, about 3000 to 10000 Å in its flat portion.

P type diffusion layers 64 and 65 are formed in the epitaxial layer 53. The P type diffusion layers 64 and 65 are disposed around the formation region of the PNP transistor 51 in the region defined by the isolation regions 54 and 55. Moreover, as shown in FIG. 3, the P type diffusion layers 64 and 65 are wired so as to have the same potential as a collector potential of the PNP transistor 51. Note that the P type diffusion layers 64 and 65 may be circularly disposed around the formation region of the PNP transistor 51, and along an arrangement of the isolation regions 54 and 55.

N type diffusion layers 66 and 67 are formed in the epitaxial layer 53. The N type diffusion layers 66 and 67 are formed so as to at least partially overlap the P type diffusion layers 64 and 65, respectively. Furthermore, the N type diffusion layers 66 and 67 are formed so as to at least partially overlap P type diffusion layers 68 and 69 included in the isolation regions 54 and 55, respectively. Moreover, although the N type diffusion layers 66 and 67 are not connected directly to a wiring layer (not shown) on the epitaxial layer 53, the base potential is substantially applied thereto through the epitaxial layer 53. Note that the N type diffusion layers 66 and 67 may be circularly disposed around the formation region of the PNP transistor 51, and along the arrangement of the isolation regions 54 and 55.

Next, as indicated by thick solid lines, the PN junction regions 57 and 58 are formed between P type diffusion layers 70 and 71 used as the collector regions of the PNP transistor 51 and the N type epitaxial layer 53 used as the back gate region. As described above, the collector potential is applied to the P type diffusion layers 57 and 58. Meanwhile, a base potential is applied to the N type epitaxial layer 53 through the N type diffusion layer 60. That is, a reverse bias is applied to the PN junction regions 70 and 71 of the PNP transistor 51.

Note that, as shown in FIG. 3, in the PNP transistor 51, the PN junction regions are formed respectively, across a boundary region between the P type diffusion layer 57 and the epitaxial layer 52, and across a boundary region between the P type diffusion layer 58 and the epitaxial layer 53. However, in this embodiment, the P type diffusion layers 57 and 58 as the collector regions and the P type diffusion layer 59 as the emitter region are disposed so as to face each other, and a region to be a current path is indicated by the thick line. That is, the PN junction regions 70 and 71 indicated by the solid lines are regions likely to break down due to current concentration caused when an overvoltage is applied thereto.

Moreover, as indicated by thick solid lines, around the formation region of the PNP transistor 51, a PN junction region 72 is formed between the P type diffusion layer 64 and the N type diffusion layer 66, and also a PN junction region 73 is formed between the P type diffusion layer 65 and the N type diffusion layer 67. As described above, the same potential as the collector potential is applied to the P type diffusion layers 64 and 65 through the wiring layer on the epitaxial layer 53. Meanwhile, the base potential is substantially applied to the N type diffusion layers 66 and 67 through the epitaxial layer 53. In other words, substantially the same reverse bias as that applied to the PN junction regions 70 and 71 is applied to the PN junction regions 72 and 73.

Here, the PN junction regions 72 and 73 are formed so as to have a junction breakdown voltage lower than that of the PN junction regions 70 and 71. For example, as shown in FIG. 3, there is a structure in which the P type diffusion layers 57 and 58 and the P type diffusion layers 64 and 65 are formed in different processes from each other. Moreover, the N type diffusion layers 66 and 67 are formed in the N type epitaxial layer 53. That is, an impurity concentration in the N type region in each of the PN junction regions 72 and 73 is increased compared with the PN junction regions 70 and 71. Specifically, by controlling the impurity concentration of the N type diffusion layers 66 and 67, the junction breakdown voltage of the PN junction regions 72 and 73 is controlled to have a desired characteristic value.

Moreover, although not shown in FIG. 3, there is a structure in which the P type diffusion layers 57, 58, 64 and 65 are formed in the same process so as to have the same impurity concentration. In this case, formation of the N type diffusion layers 66 and 67 in the N type epitaxial layer 53 increases the impurity concentration on the N type region side in the PN junction regions 72 and 73 compared with the PN junction regions 70 and 71. Specifically, by controlling the impurity concentration of the N type diffusion layers 66 and 67, the junction breakdown voltage of the PN junction regions 72 and 73 is controlled so that the PN junction regions 72 and 73 have the desired characteristic value.

By use of the structure described above, for example, when an overvoltage, for example, negative ESD surge is applied to a pad for a collector electrode in the PNP transistor 51, the PN junction regions 72 and 73 break down before the PN junction regions 70 and 71 break down. Accordingly, a breakdown current flows through the PN junction regions 72 and 73 to prevent breakdown of the PN junction regions 70 and 71. Thereby, the PNP transistor 51 can be protected from the ESD surge. Specifically, protection elements having the PN junction regions 72 and 73 are operated against the ESD surge, and thereby the PNP transistor 51 can be protected.

Furthermore, in the protection elements having the PN junction regions 72 and 73, the PN junction regions 72 and 73 are formed across wide regions by disposing the P type diffusion layers 64 and 65 and the N type diffusion layers 66 and 67, and along the arrangement of the isolation regions 54 and 55. By use of this structure, concentration of the breakdown current in the PN junction regions 72 and 73 can be prevented. Thus, it is possible to suppress breakdown of the protection elements having the PN junction regions 72 and 73.

Furthermore, the protection elements having the PN junction regions 72 and 73 are formed by utilizing the isolation regions 54 and 55 within the element formation region defined by the isolation regions 54 and 55. By use of this structure, the junction breakdown voltage of the protection element can be determined according to each of semiconductor elements formed in the element formation region defined by the isolation regions. That is, protection elements suitable for the respective semiconductor elements can be individually disposed, and thereby each of the semiconductor elements can be protected from the ESD surge and the like. For example, even when an ESD surge protection element is disposed around the pad for the collector electrode, the semiconductor elements can be more surely protected by further forming the above-described protection elements in formation regions of the respective semiconductor elements. Moreover, an actual operation region of a chip can be effectively utilized by including the protection elements in each of the element formation regions by using the isolation regions.

Next, also in the PNP transistor 51 shown in FIG. 3, each of the protection elements having the PN junction regions 72 and 73 operates as a bipolar transistor, as in the case of the NPN transistor 1 described with reference to FIGS. 1 and 2. The PNP transistor 51 is a PNP transistor in which the P type diffusion layers 64 and 65 are emitter regions, the N type diffusion layers 66 and 67 are base regions, and the P type diffusion layers 68, 69, 74 and 75 are collector regions.

For example, considered is the case where negative ESD surge is applied to the pad for the collector electrode in the PNP transistor 51. When the PN junction regions 72 and 73 break down, a current flows between the base and the emitter of the PNP transistor, and the PNP transistor is turned on. When the PNP transistor is turned on, a breakdown current flows into the substrate 52. Specifically, when each of the protection elements having the PN junction regions 72 and 73 operates as a bipolar transistor, the breakdown current flows into the substrate 52 and disperses therein.

As described above with reference to FIGS. 1 and 2, when the breakdown current flows between the base and the emitter of the PNP transistor, the PNP transistor is turned on. In this event, when the PNP transistor is turned on, the conductivity of the P type diffusion layers 68, 69, 74 and 75 used as the collector regions is modulated. Accordingly, the resistance value thereof is significantly reduced, and the current capacity thereof is improved. Specifically, when each of the protection elements having the PN junction regions 72 and 73 operates as the bipolar transistor, capacity of the breakdown current flowing into the substrate 52 is improved.

Moreover, as described above with reference to FIGS. 1 and 2, when the breakdown current flows through the isolation regions 54 and 55, potentials respectively of the substrate 52 and the isolation regions 54 and 55 are changed. By operating each of the protection elements as the bipolar transistor, a range of potential changes in the substrate 52 and the isolation regions 54 and 55 can be decreased. Accordingly, malfunction of semiconductor elements formed in other element formation regions due to the potential change in the substrate 52 can be prevented.

Meanwhile, for example, when positive ESD surge is applied to the pad for the collector electrode in the PNP transistor 51, a forward bias is applied to the PN junction regions 70 and 71 and the PN junction regions 72 and 73. In this case, as described above, each of the PN junction regions 72 and 73 becomes a region having low resistance by the N type diffusion layers 66 and 67. Moreover, by disposing the P type diffusion layers 64 and 65 and the N type diffusion layers 66 and 67 along the isolation regions 54 and 55, the width of a current path is increased. Accordingly, each of the PN junction regions 72 and 73 becomes a region having much lower resistance. By use of this structure, a current generated by application of the positive ESD surge flows into the substrate 52 mainly through the PN junction regions 72 and 73. Also in this event, when each of the protection elements having the PN junction regions 72 and 73 operates as the bipolar transistor, capacity of the current flowing into the substrate 52 is improved. Moreover, the PNP transistor 51 is protected by preventing breakdown of the PN junction regions 70 and 71 due to concentration of the current generated by application of the positive ESD surge.

Next, with reference to FIGS. 11 to 17, detailed description will be given of a method of manufacturing a semiconductor device according to the second embodiment of the present invention. FIGS. 11 to 17 are cross-sectional views showing the method of manufacturing a semiconductor device according to this embodiment. Note that FIGS. 11 to 17 show a method of manufacturing the semiconductor device shown in FIG. 3.

Figure 11:
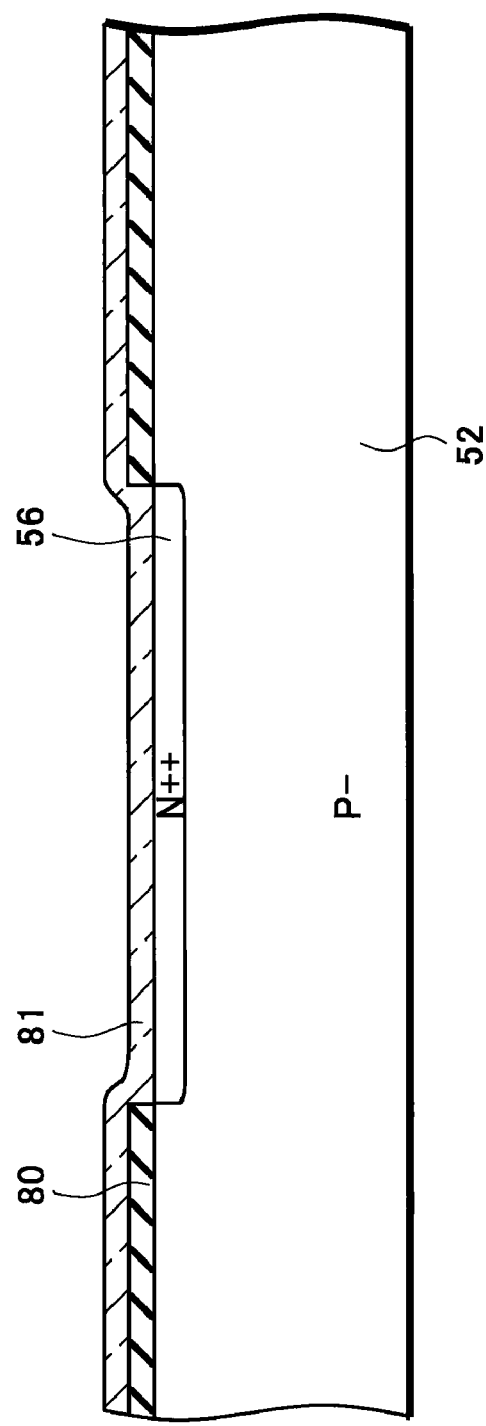
FIG. 11 is a firth cross-sectional view showing the method of manufacturing a semiconductor device according to the first embodiment of the present invention.

First, as shown in FIG. 11, a P type single crystal silicon substrate 52 is prepared. A silicon oxide film 80 is formed on the substrate 52, and the silicon oxide film 80 is selectively removed so as to form an opening in a formation region for an N type buried diffusion layer 56. Thereafter, by using the silicon oxide film 80 as a mask, a liquid source 81 containing an N type impurity, for example, antimony (Sb) is applied onto a surface of the substrate 52 by use of a spin-coating method. Subsequently, after antimony (Sb) is thermally diffused to form the N type buried diffusion layer 56, the silicon oxide film 80 and the liquid source 81 are removed.

Figure 12:
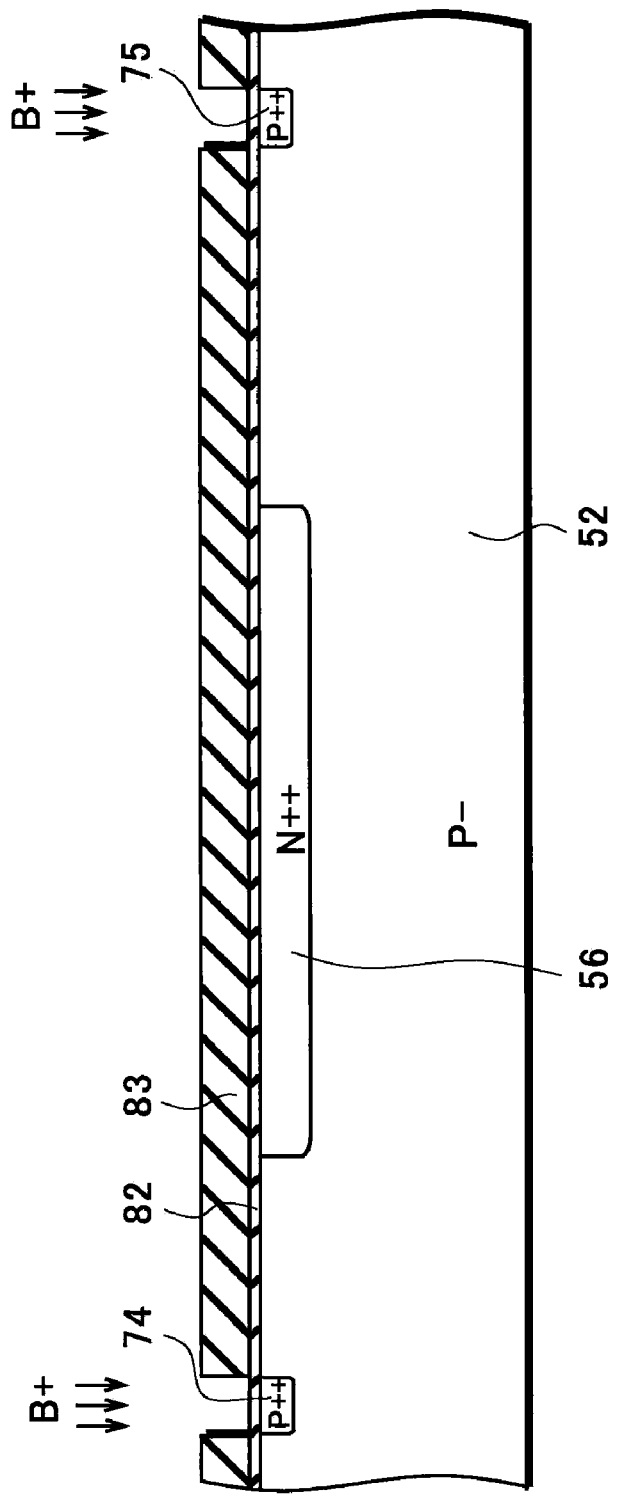
FIG. 12 is a second cross-sectional view showing the method of manufacturing a semiconductor device according to the second embodiment of the present invention.

Next, as shown in FIG. 12, a silicon oxide film 82 is formed on the substrate 52 and a photoresist 83 is formed on the silicon oxide film 82. Thereafter, by use of a heretofore known photolithography technique, openings are formed in the photoresist 83 on regions where P type buried diffusion layers 74 and 75 are to be respectively formed. Subsequently, ions of a P type impurity, for example, boron (B) are implanted from the surface of the substrate 52 at an accelerating voltage of 40 to 180 (keV) and a dose of $1.0 \times 10^{13}$ to $1.0 \times 10^{16}$ (/cm$^2$). After the photoresist 83 is removed and the P type buried diffusion layers 74 and 75 are formed by thermal diffusion, the silicon oxide film 82 is removed.

Figure 13:
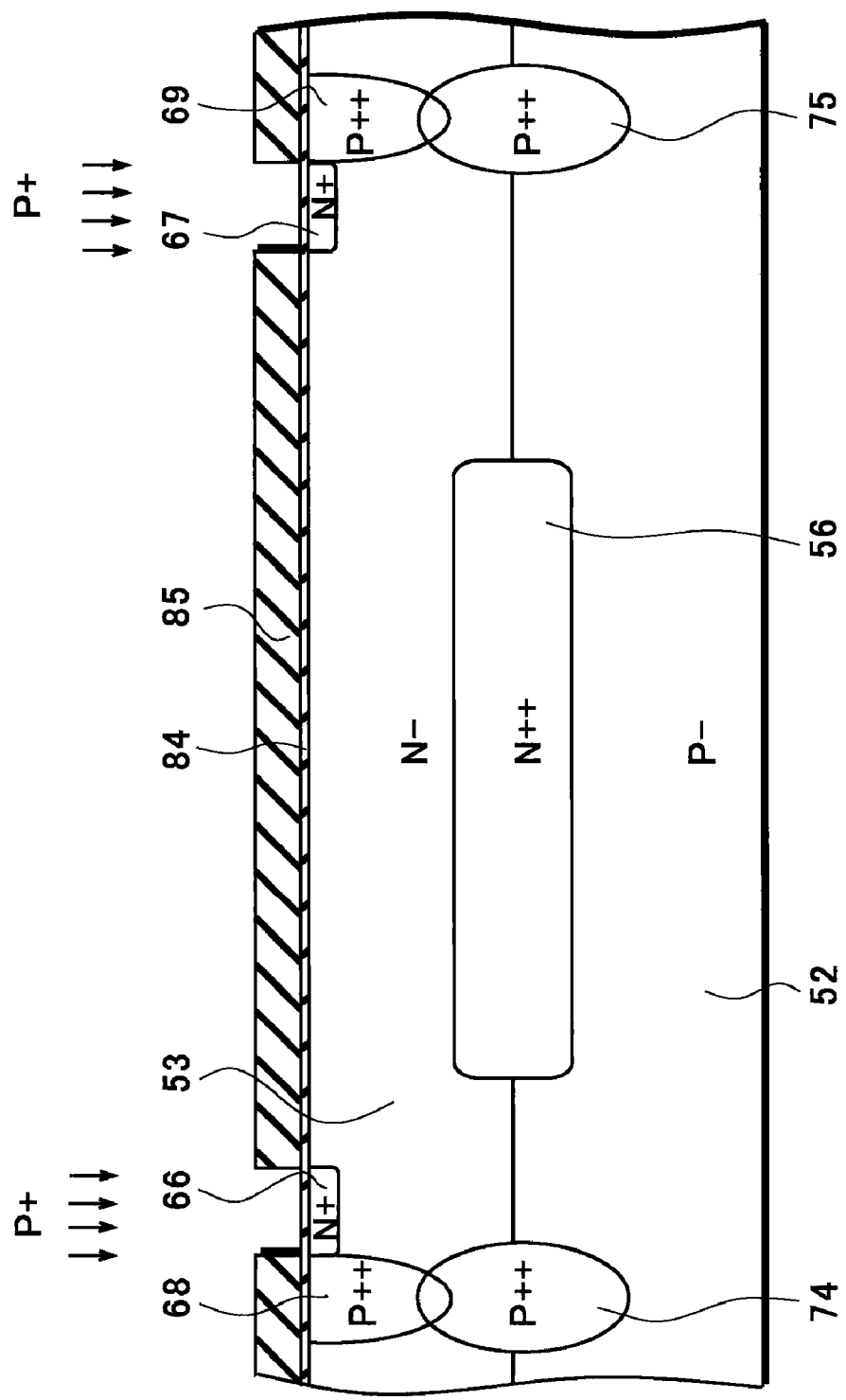
FIG. 13 is a third cross-sectional view showing the method of manufacturing a semiconductor device according to the second embodiment of the present invention.

Next, as shown in FIG. 13, the substrate 52 is placed on a susceptor of a vapor phase epitaxial growth apparatus, and an N type epitaxial layer 53 is formed on the substrate 52. The vapor phase epitaxial growth apparatus mainly includes a gas supply system, a reactor, an exhaust system and a control system. In this embodiment, by use of a vertical reactor, thickness uniformity of the epitaxial layer can be improved. The N type buried diffusion layer 56 and the P type buried diffusion layers 74 and 75 are thermally diffused by heat treatment in the step of forming the epitaxial layer 53.

Next, by use of the heretofore known photolithography technique, P type diffusion layers 68 and 69 are formed in the epitaxial layer 53. Thereafter, a silicon oxide film 84 is formed on the epitaxial layer 53, and a photoresist 85 is formed on the silicon oxide film 84. Subsequently, by use of the heretofore known photolithography technique, openings are formed in the photoresist 85 on regions where N type diffusion layers 66 and 67 are to be respectively formed. Thereafter, ions of an N type impurity, for example, phosphorus (P) are implanted from the surface of the epitaxial layer 53 at an accelerating voltage of 40 to 180 (keV) and a dose of $1.0 \times 10^{13}$ to $1.0 \times 10^{16}$ (/cm$^2$). Subsequently, the photoresist 85 is removed, and the N type diffusion layers 66 and 67 are formed by thermal diffusion. Note that an impurity concentration of the N type diffusion layers 66 and 67 is controlled so as to cause a junction breakdown voltage of PN junction regions 72 and 73 (see FIG. 3) to be lower than that of PN junction regions 70 and 71 (see FIG. 3).

Figure 14:
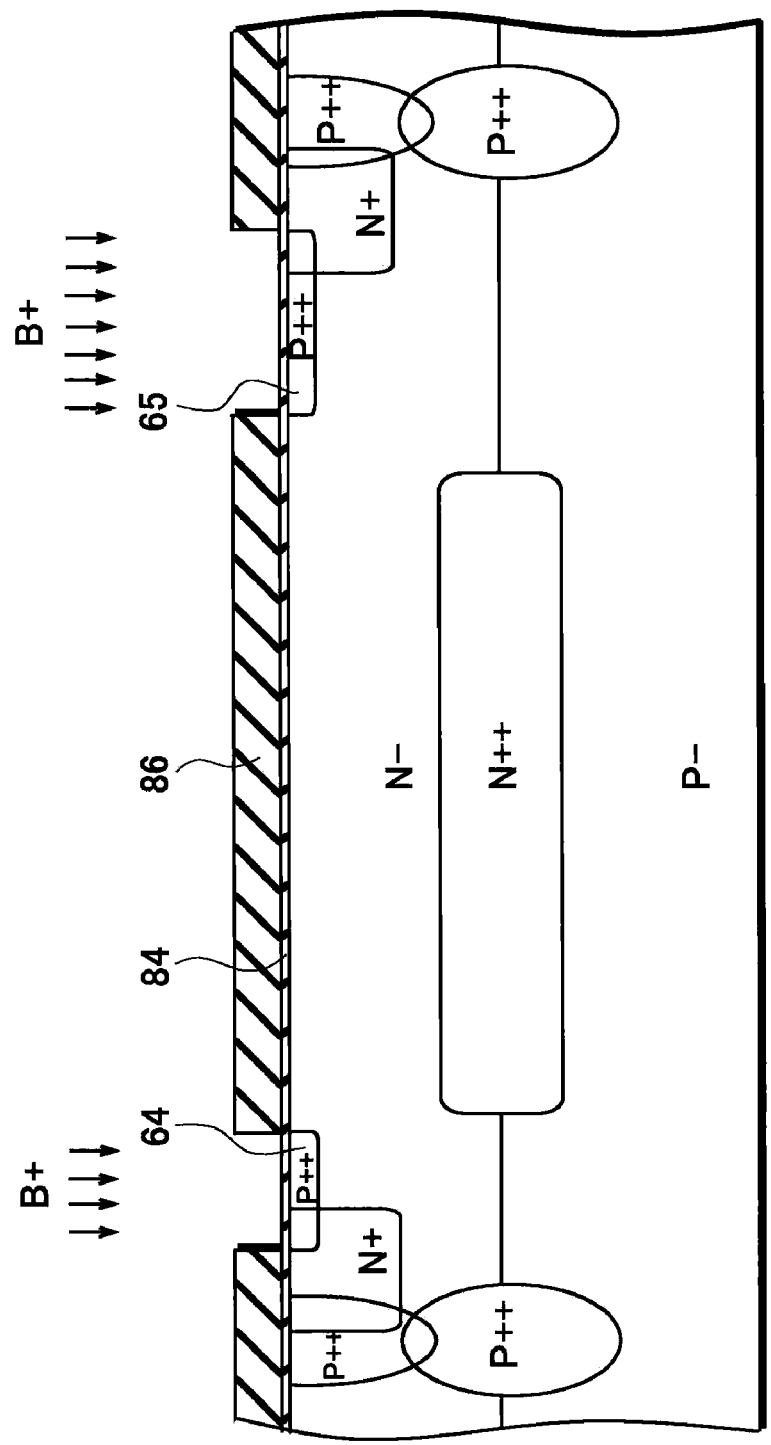
FIG. 14 is a fourth cross-sectional view showing the method of manufacturing a semiconductor device according to the second embodiment of the present invention.

Next, as shown in FIG. 14, a photoresist 86 is formed on the silicon oxide film 84. Thereafter, by use of the heretofore known photolithography technique, openings are formed in the photoresist 86 on regions where P type diffusion layers 64 and 65 are to be respectively formed. Subsequently, ions of a P type impurity, for example, boron (B) are implanted from the surface of the epitaxial layer 53 at an accelerating voltage of 30 to 200 (keV) and a dose of $1.0 \times 10^{16}$ to $1.0 \times 10^{18}$ (/cm$^2$). After the photoresist 86 is removed and the P type diffusion layers 64 and 65 are formed by thermal diffusion, the silicon oxide film 84 is removed. Note that an impurity concentration of the P type diffusion layers 64 and 65 is controlled so as to cause the junction breakdown voltage of the PN junction regions 72 and 73 (see FIG. 3) to be lower than that of the PN junction regions 70 and 71 (see FIG. 3).

Figure 15:
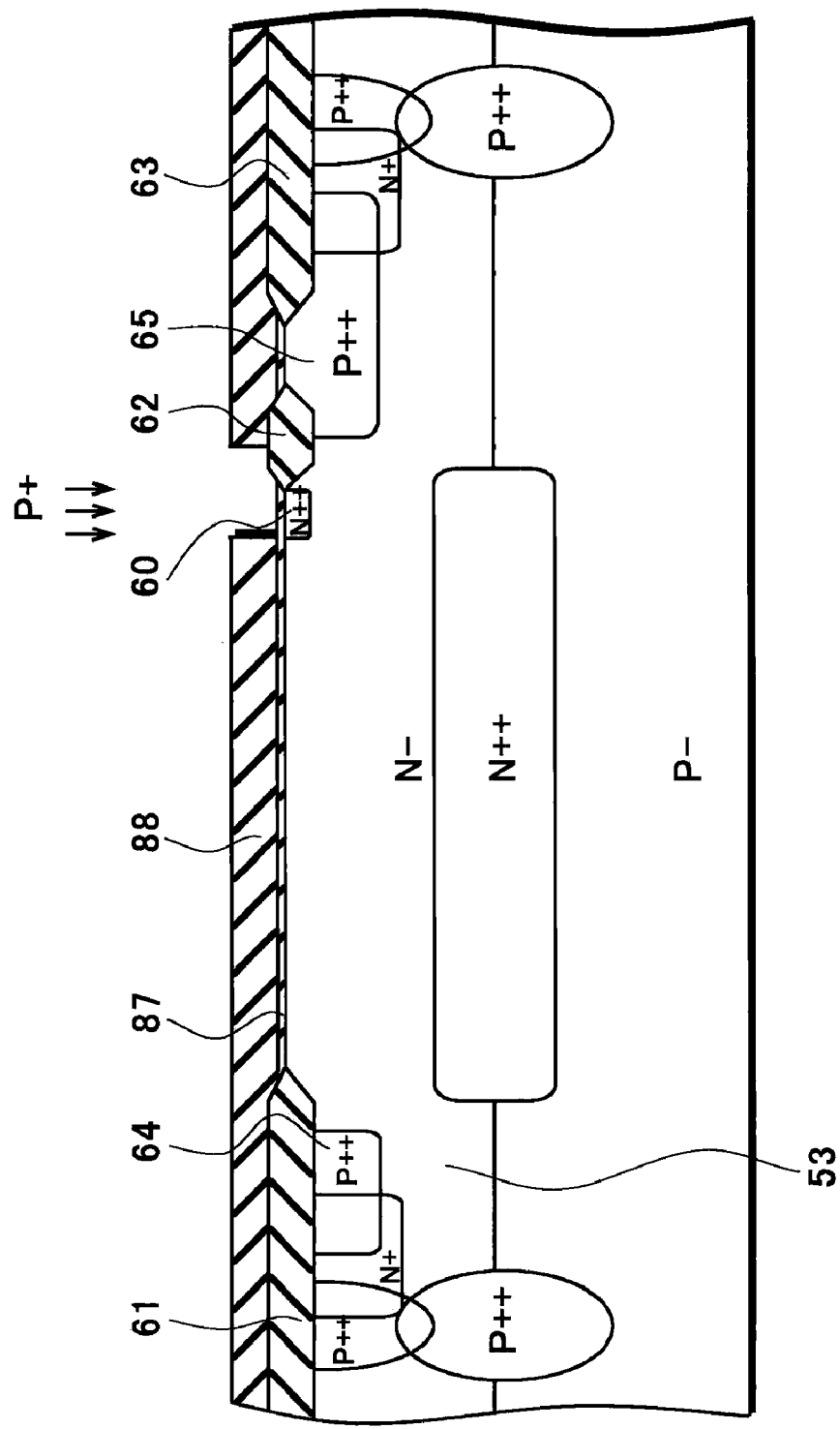
FIG. 15 is a fifth cross-sectional view showing the method of manufacturing a semiconductor device according to the second embodiment of the present invention.

Next, as shown in FIG. 15, LOCOS oxide films 61 to 63 are formed in desired regions of the epitaxial layer 53. Thereafter, a silicon oxide film 87 is formed on the epitaxial layer 53, and a photoresist 88 is formed on the silicon oxide film 87. By use of the heretofore known photolithography technique, an opening is formed in the photoresist 88 on a region where an N type diffusion layer 60 is to be formed. Subsequently, ions of an N type impurity, for example, phosphorus (P) is implanted from the surface of the epitaxial layer 53 at an accelerating voltage of 70 to 190 (keV) and a dose of $1.0\times10^{14}$ to $1.0\times10^{16}$ (/cm$^2$). Thereafter, the photoresist 88 is removed, and the N type diffusion layer 60 is formed by thermal diffusion.

Figure 16:
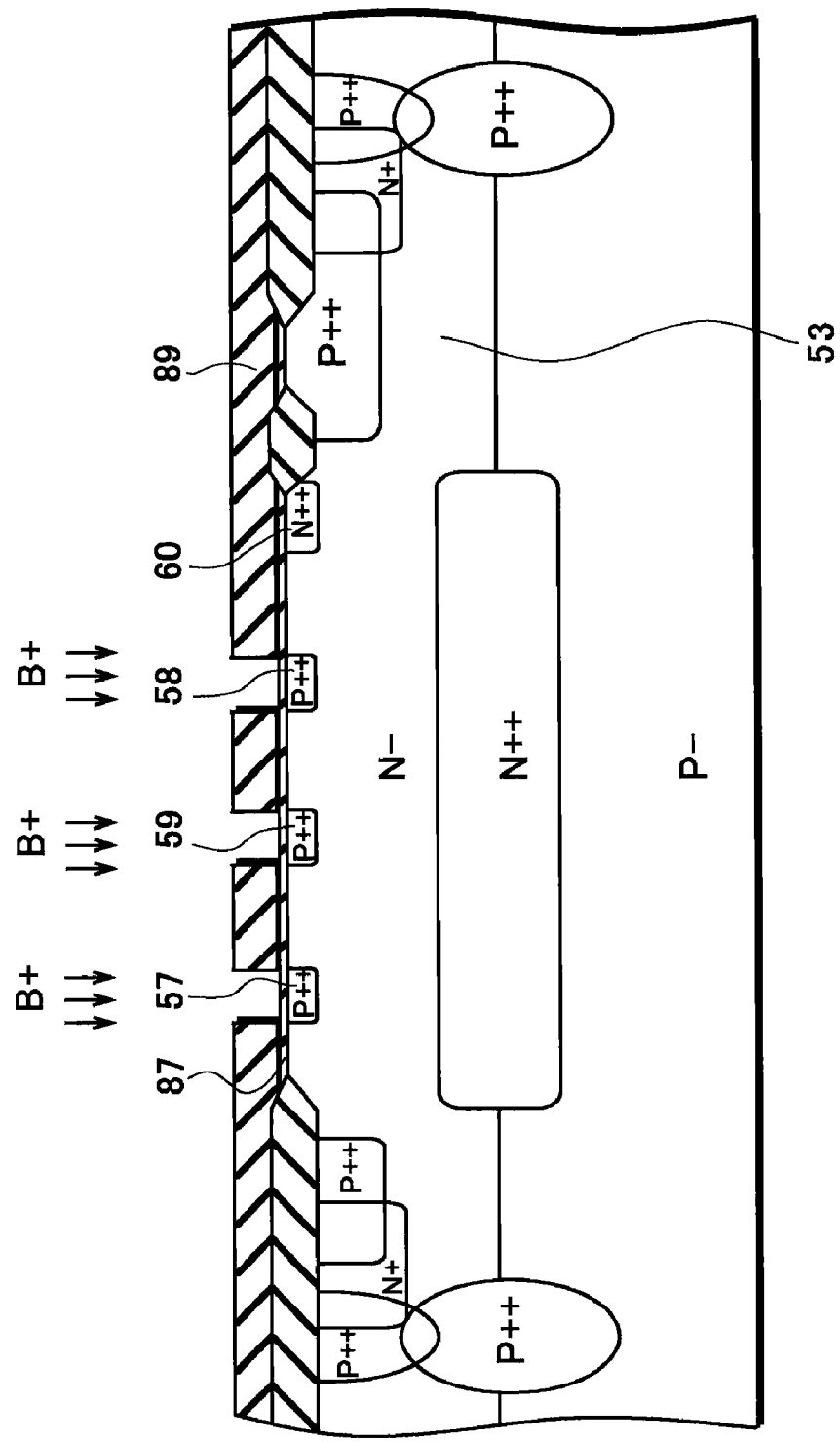
FIG. 16 is a sixth cross-sectional view showing the method of manufacturing a semiconductor device according to the second embodiment of the present invention.

Next, as shown in FIG. 16, a photoresist 89 is formed on the silicon oxide film 87. By use of the heretofore known photolithography technique, openings are formed in the photoresist 89 on regions where P type diffusion layers 57 to 59 are to be formed. Subsequently, ions of a P type impurity, for example, boron (B) is implanted from the surface of the epitaxial layer 53 at an accelerating voltage of 30 to 200 (keV) and a dose of $1.0\times10^{16}$ to $1.0\times10^{18}$ (/cm$^2$). Thereafter, the photoresist 89 is removed, and the P type diffusion layers 57 to 59 are formed by thermal diffusion.

Figure 17:
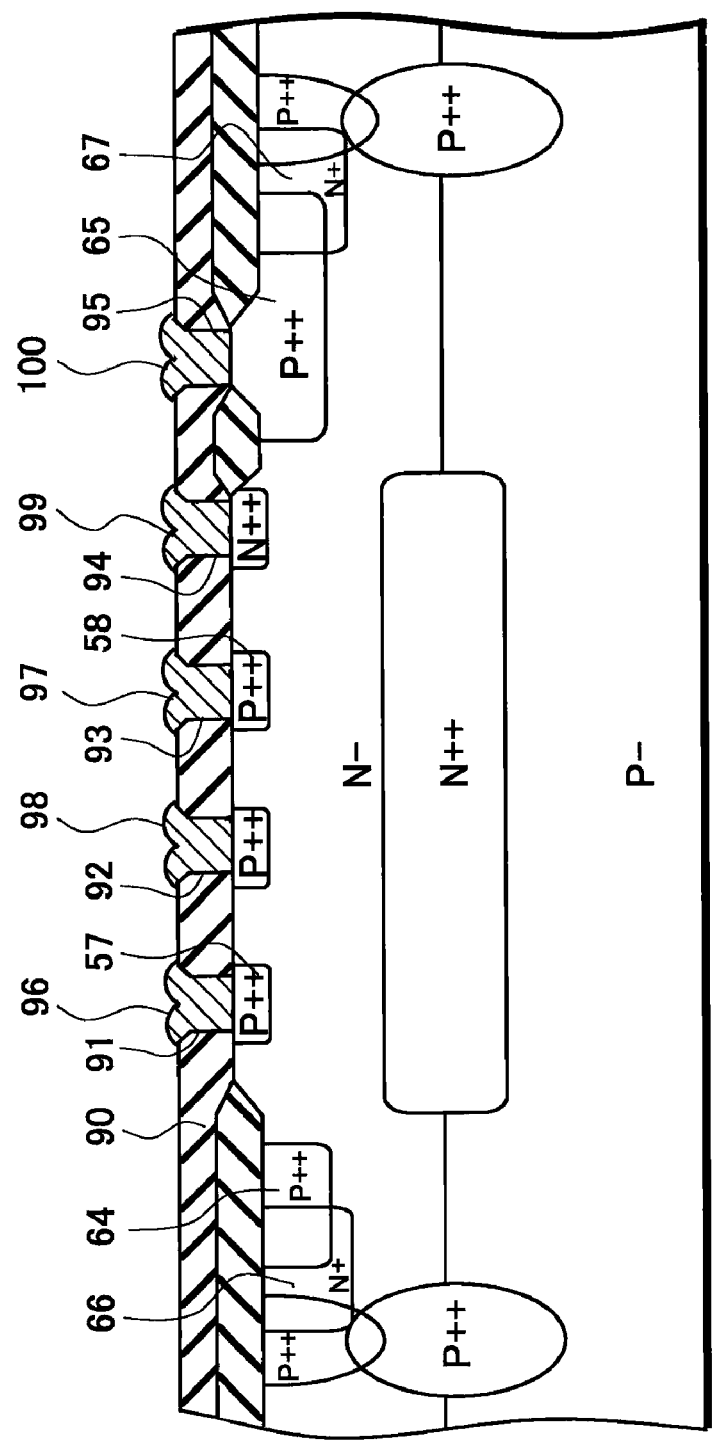
FIG. 17 is a seventh cross-sectional view showing the method of manufacturing a semiconductor device according to the second embodiment of the present invention.

Next, as shown in FIG. 17, as an insulating layer 90, for example, a BPSG (Boron Phospho Silicate Glass) film, a SOG (Spin On Glass) film or the like is deposited on the epitaxial layer 53. Thereafter, by use of the heretofore known photolithography technique, contact holes 91 to 95 are formed in the insulating layer 90 by dry etching using, for example, CHF$_3$ or CF$_4$ gas. In the contact holes 91 to 95, aluminum alloy films made of, for example, an Al—Si film, an Al—Si—Cu film, an Al—Cu film and the like are selectively formed. Accordingly, collector electrodes 96 and 97, an emitter electrode 98, a base electrode 99, and an electrode 100 to be connected to the P type diffusion layer 65 are formed.

Note that, in this embodiment, description has been given of the case where the P type diffusion layers 57 and 58 and the P type diffusion layers 64 and 65 are formed in different processes. However, the embodiment of the present invention is not limited to this case. For example, the P type diffusion layers 57, 58, 64 and 65 may be formed in the same process. In this case, the P type diffusion layers 57, 58, 64 and 65 are diffusion layers formed under the same conditions and to have the same impurity concentration. As a result, by controlling conditions for forming the N type diffusion layers 66 and 67, for example, the impurity concentration thereof, the junction breakdown voltage of the PN junction regions 72 and 73 is caused to be lower than that of the PN junction regions 70 and 71. In other words, the junction breakdown voltage is determined by the conditions for forming the N type diffusion layers 66 and 67. Accordingly, control of the junction breakdown voltage is facilitated. Besides the above, various modifications can be made without departing from the scope of the embodiment of the present invention.

In the embodiment of the present invention, the protection element having the junction region which breaks down before the junction region of the bipolar transistor is formed around the bipolar transistor. This structure can protect the bipolar transistor from the overvoltage.

Moreover, in the embodiment of the present invention, the protection element formed around the bipolar transistor operates as a bipolar transistor. With this structure, capability of discharging the current generated by the overvoltage is improved.

Moreover, in the embodiment of the present invention, the protection element having the junction region which breaks down before the junction region of the bipolar transistor is connected to the substrate through the isolation region. This structure makes it possible to cause the current, which is generated by the overvoltage, to flow into the substrate, and thereby to disperse the current in the substrate.

Moreover, in the embodiment of the present invention, the protection element having the junction region which breaks down before the junction region of the bipolar transistor is formed by utilizing the isolation region. By use of this structure, a protection element suitable for an individual semiconductor element is formed in each element formation region.

What is claimed is:

1. A semiconductor device comprising:
    a semiconductor layer;
    a bipolar transistor formed in the semiconductor layer;
    a first junction region between the semiconductor layer and a diffusion layer included in the bipolar transistor; and
    a protection element, which is disposed around a formation region of the bipolar transistor, and which has a second junction region having a junction breakdown voltage lower than that of the first junction region.

2. The semiconductor device according to claim 1, further comprising:
    an isolation region which divides the semiconductor layer into a plurality of regions,
    wherein the bipolar transistor is formed in one of the plurality of regions divided by the isolation region, and
    the protection element is formed by utilizing the isolation region surrounding the formation region of the bipolar transistor.

3. The semiconductor device according to claim 1, wherein
    the semiconductor layer is formed by stacking a semiconductor substrate of one conductivity type with at least one epitaxial layer of opposite conductivity type,
    the second junction region is formed of a first diffusion layer of the one conductivity type and a diffusion layer of the opposite conductivity type, the first diffusion layer of the one conductivity type connected by wiring to the diffusion layer used as a base region of the bipolar transistor, and the diffusion layer of the opposite conductivity type formed in the epitaxial layer, and
    the diffusion layer of the opposite conductivity type is disposed so as to overlap a second diffusion layer of the one conductivity type connected to the semiconductor substrate.

4. The semiconductor device according to claim 3, further comprising:
    an isolation region which divides the epitaxial layer,
    wherein the second diffusion layer of the one conductivity type is a diffusion layer included in the isolation region.

5. The semiconductor device according to claim 4, wherein the first diffusion layer of the one conductivity type and the diffusion layer of the opposite conductivity type are circularly disposed around the formation region of the bipolar transistor, and along a formation region of the isolation region.

6. The semiconductor device according to one of claims 1 and 3, wherein the protection element operates as a bipolar transistor.

7. The semiconductor device according to claim 1, wherein
    the semiconductor layer is formed by stacking a semiconductor substrate of one conductivity type with at least one epitaxial layer of opposite conductivity type,
    the second junction region is formed of a first diffusion layer of the one conductivity type and a diffusion layer of the opposite conductivity type, the first diffusion layer of the one conductivity type connected by wiring to the diffusion layer used as a collector region of the bipolar transistor, and the diffusion layer of the opposite conductivity type formed in the epitaxial layer, and
    the diffusion layer of the opposite conductivity type is disposed so as to overlap a second diffusion layer of the one conductivity type connected to the semiconductor substrate.

8. The semiconductor device according to claim 7, further comprising:

an isolation region which divides the epitaxial layer wherein the second diffusion layer of the one conductivity type is a diffusion layer included in the isolation region.

9. The semiconductor device according to claim 8, wherein the first diffusion layer of the one conductivity type and the diffusion layer of the opposite conductivity type are circularly disposed around the formation region of the bipolar transistor, and along a formation region of the isolation region.

10. The semiconductor device according to claim 7, wherein the protection element operates as a bipolar transistor.

* * * * *